(12) United States Patent
Fujiwara et al.

(10) Patent No.: US 7,061,113 B2
(45) Date of Patent: Jun. 13, 2006

(54) SEMICONDUCTOR APPARATUS, LED HEAD, AND IMAGE FORMING APPARATUS

(75) Inventors: Hiroyuki Fujiwara, Hachioji (JP); Mitsuhiko Ogihara, Hachioji (JP)

(73) Assignee: Oki Data Corporation, Tokyo (JP)

( * ) Notice: Subject to any disclaimer, the term of this patent is extended or adjusted under 35 U.S.C. 154(b) by 124 days.

(21) Appl. No.: 10/926,890

(22) Filed: Aug. 26, 2004

(65) Prior Publication Data

US 2005/0082673 A1 Apr. 21, 2005

(30) Foreign Application Priority Data

Aug. 29, 2003 (JP) .............................. 2003-306483

(51) Int. Cl.
*H01L 23/48* (2006.01)

(52) U.S. Cl. ................... 257/758; 257/758; 257/761; 257/763; 257/E23.16

(58) Field of Classification Search ............... 257/758, 257/761, 763, E23.16
See application file for complete search history.

(56) References Cited

U.S. PATENT DOCUMENTS 6,545,359 B1 * 4/2003 Ohtani et al. ............... 257/758

FOREIGN PATENT DOCUMENTS

JP        10-150221 A     6/1998

* cited by examiner

*Primary Examiner*—Mai-Huong Tran
(74) *Attorney, Agent, or Firm*—Akin Gump Strauss Hauer & Feld, LLP

(57) ABSTRACT

A semiconductor apparatus has a substrate to which is attached a thin semiconductor film including at least one semiconductor device. A first interconnecting line formed on the thin semiconductor film makes electrical contact with the semiconductor device. A second interconnecting line extends from the thin semiconductor film to the substrate, electrically coupling the first interconnecting line to an interconnection pattern on the substrate. At the point where the first and second interconnecting lines meet, one of the two interconnecting lines is widened to provide an increased positioning margin, thereby relaxing the requirement for precise positioning of the thin semiconductor film. The thin semiconductor film may include an array of light-emitting diodes and the substrate may include driving circuitry for driving them.

18 Claims, 19 Drawing Sheets

SEMICONDUCTOR APPARATUS, LED HEAD, AND IMAGE FORMING APPARATUS

BACKGROUND OF THE INVENTION

1. Field of the Invention

The present invention relates to a semiconductor apparatus having a thin semiconductor film attached to a substrate, and more particularly to the electrical interconnections between the thin semiconductor film and the substrate. The invention also relates to image forming apparatus using the invented semiconductor device.

2. Description of the Related Art

An example of an image forming apparatus in which the invention can be applied is an electrophotographic printer employing light-emitting diodes as light sources. A conventional electrophotographic printer of this type has a light-emitting diode (LED) head comprising a linear array of LEDs paralleled by driver circuits that supply current to the LEDs. The LEDs are formed in one or more compound semiconductor chips comprising, for example, gallium arsenide (GaAs); the driver circuits are integrated into one or more silicon (Si) semiconductor chips. The LED array chips and the driver integrated circuit (IC) chips are interconnected by wire bonding, and have pads for the attachment of bonding wires.

The wire bonding pads are in general larger than the LEDs. If a separate wire bonding pad is provided for each LED, the layout of the wire bonding pads presents a problem to which various solutions have been adopted. One solution, for example, employs a staggered arrangement of wire bonding pads and offsets the wiring that leads from the wire bonding pads to the LEDs, as described in Japanese Unexamined Patent Application Publication No. 10-150221.

Regardless of how the wire bonding pads are laid out, they take up considerable space on each LED array chip. From the standpoint of effective use of expensive compound semiconductor materials, this is highly uneconomical, and it prevents the cost of the LED array chips from being reduced beyond a certain point. The wire bonding pads on the driver chips are similarly uneconomical.

Furthermore, although an LED array chip is typically about three hundred micrometers (300 µm) thick, the LEDs occupy only about the uppermost five micrometers (5 µm) of the chip thickness, the rest of the thickness being necessary merely for mechanical support. This also is uneconomical: only about 1/60 of the expensive compound semiconductor material is disposed at a depth shallow enough to be useful for emitting light.

A desirable solution to this problem would be to form the LEDs in a thin compound semiconductor film attached to the silicon substrate of the driver chips, and connect the LEDs to their driver circuits through conductive lines formed on the chip surface, instead of by wire bonding. Considerable compound semiconductor material could then be saved, since none would have to be used for mechanical support, or to provide space for wire bonding pads. Alignment of the electrical interconnections between the thin film and the substrate, however, then becomes a problem. If conductive lines run directly from the LEDs to the driver circuits, the thin semiconductor film needs to be positioned very accurately with respect to the output terminals of the driver circuits, making the combined LED and driver chip expensive to manufacture. Quality also becomes a problem, as the electrical characteristics of the combined LED/driver chip become very sensitive to slight alignment inaccuracies.

SUMMARY OF THE INVENTION

An object of the present invention is to reduce the manufacturing cost of a semiconductor device comprising a thin semiconductor film attached to a substrate by relaxing the alignment tolerance between the thin semiconductor film and the substrate.

The invented semiconductor apparatus has a substrate with an electrical interconnection pattern formed in a first area. A thin semiconductor film is attached to the substrate in a second area, after being formed separately from the substrate. The thin semiconductor film includes at least one semiconductor device. A first interconnecting line disposed at least partly on the thin semiconductor film has a first end making electrical contact with the semiconductor device, a second end, and an interconnecting part interconnecting the first and second ends. A second interconnecting line disposed at least partly on the substrate has a first end making electrical contact with the electrical interconnection pattern of the substrate, a second end making electrical contact with the second end of the first interconnecting line, and an interconnecting part interconnecting the first and second ends of the second interconnecting line.

The second end of either the first or the second interconnecting line, or both the first and second interconnecting lines, is wider than the interconnecting parts of the first and second interconnecting lines. This extra width provides an alignment margin that enables the alignment tolerance of the thin semiconductor film to be relaxed.

The invention also provides an optical print head such as an LED head including the invented semiconductor apparatus. The optical print head may also include a base for supporting the semiconductor apparatus, a rod lens array for focusing light emitted by light-emitting semiconductor devices in the semiconductor apparatus, a holder for holding the rod lens array, and at least one clamp for holding the base and the holder together.

The invention also provides an image-forming apparatus comprising at least one optical print head including the invented semiconductor apparatus. The image-forming apparatus may also include a photosensitive image carrier electrically charged by a charging unit and selectively illuminated by the optical print head to form a latent electrostatic image, a developing unit for supplying a recording agent to develop the latent electrostatic image on the photosensitive image carrier, and a transfer unit for transferring the developed image from the photosensitive image carrier to printing media.

Relaxing the alignment tolerance of the thin semiconductor film makes the invented semiconductor apparatus easier and therefore less expensive to manufacture. The invented semiconductor apparatus is also economical because it is small in size and makes efficient use of semiconductor materials.

DETAILED DESCRIPTION OF THE INVENTION

Figure 1:
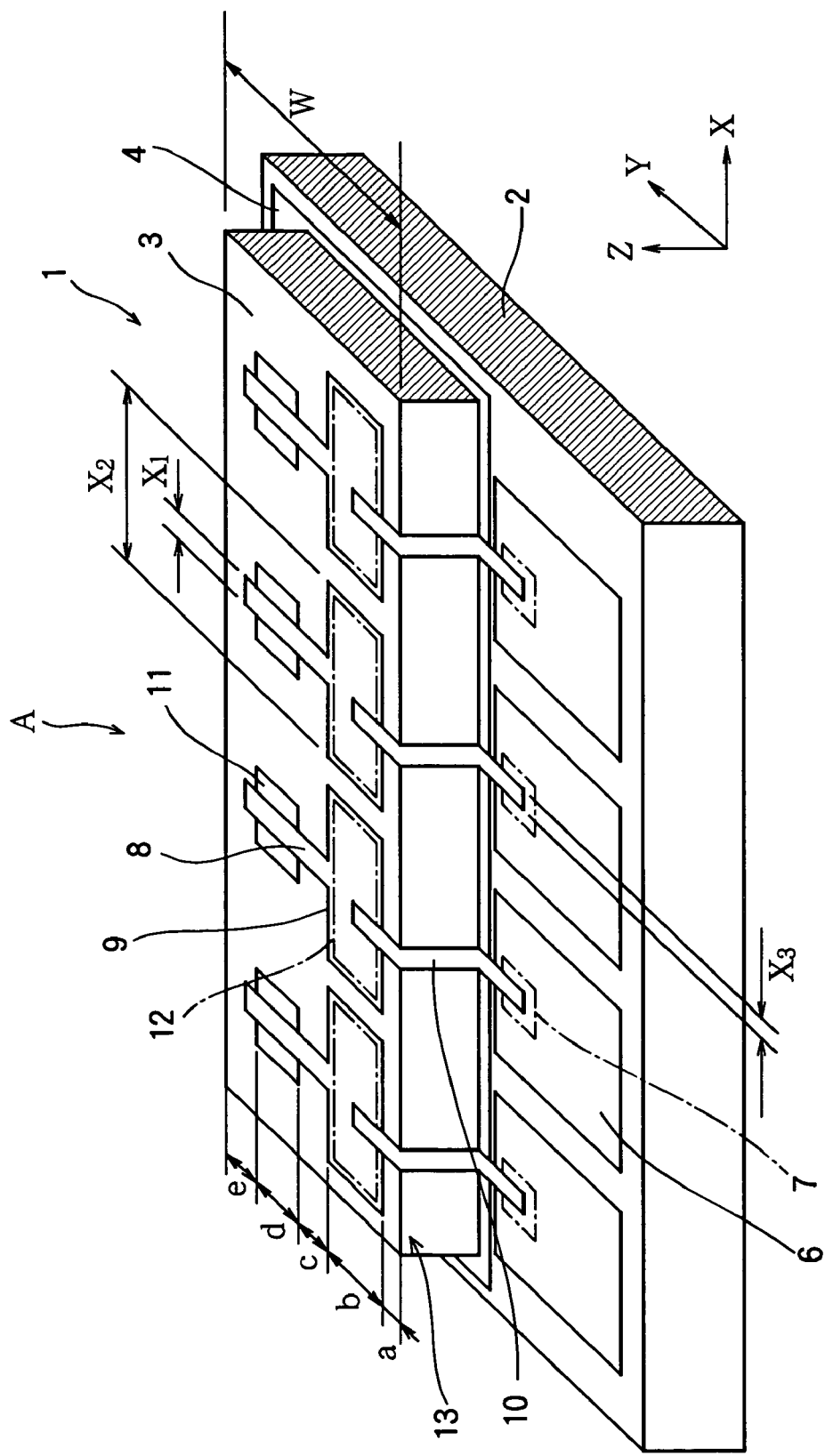
FIG. 1 is a perspective view schematically showing part of a combined LED/driver IC chip according to a first embodiment of the invention.
Figure 2:
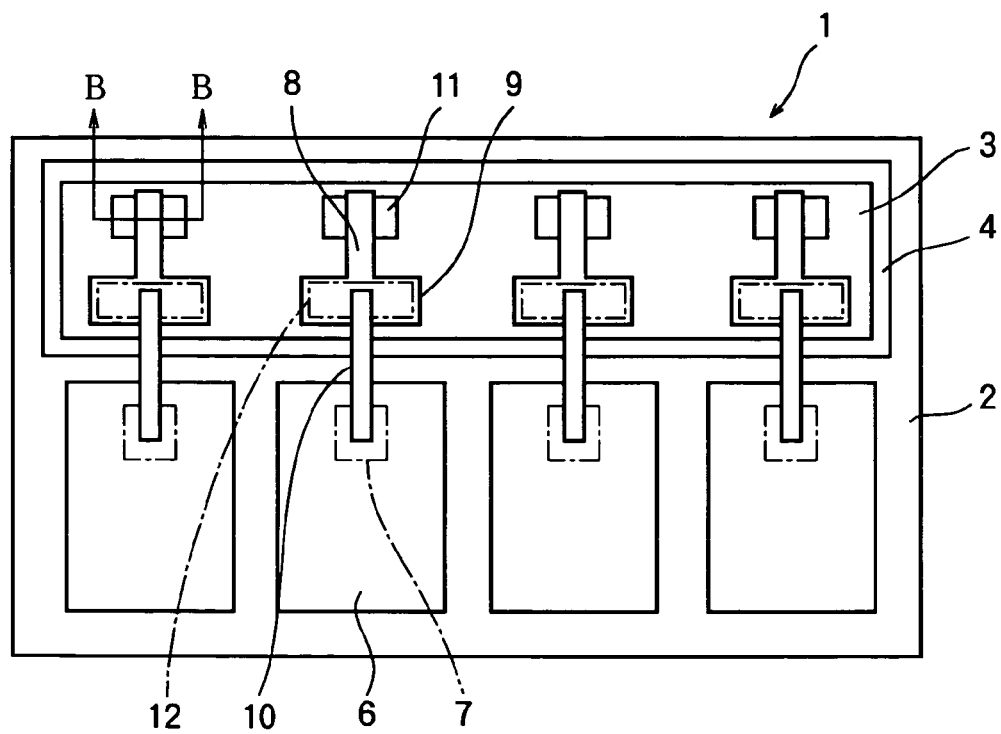
FIG. 2 is a top view showing part of the combined LED/driver IC chip as seen from the direction of arrow A in FIG. 1.

Embodiments of the invention will now be described with reference to the attached drawings, in which like elements are indicated by like reference characters.

First Embodiment

Referring to FIG. 1, a combined LED/driver IC chip 1 according to a first embodiment of the invention comprises a silicon substrate 2 to which a thin compound semiconductor film, referred to below as an LED epitaxial film or LED epi-film 3, is attached. More precisely, the LED epi-film 3 is attached to a metal layer 4 formed on part of one major surface of the silicon substrate 2. The LED epi-film 3 has a plurality of light-emitting devices 11 (LEDs) formed at regular intervals in a linear array. LED driving circuitry for driving the LEDs 11 is formed in the silicon substrate 2, and includes a plurality of output areas 6 facing respective LEDs 11. An output stage (not visible) including an output transistor and its on-off switching circuit is formed in each output area 6. The LED driving circuitry also includes an electrical interconnection pattern such as a multilayer metal pattern with an output terminal in each output area 6.

A plurality of first interconnecting lines 8 are formed on the LED epi-film 3. At its first end, each first interconnecting line 8 passes over one of the LEDs 11. At its second end, each first interconnecting line 8 terminates in an electrode pad 9. The electrode pads 9 are disposed proximate and parallel to the edge 13 of the LED epi-film 3 facing the output areas 6, so that each electrode pad 9 is near the output area 6 facing the corresponding LED 11. The electrode pad 9 is electrically connected to the facing output area 6 by a second interconnecting line 10.

The surfaces of the silicon substrate 2 and LED epi-film 3 are partly covered by an interlayer dielectric film having contact holes 7, 12 that permit the second interconnecting lines 10 to make electrical contact with the output terminals of the driving circuits in the output areas 6, and with the electrode pads 9. This interlayer dielectric film covers the surface and sides of the LED epi-film 3, the exposed parts of the metal layer 4, and enough of the surface of the silicon substrate 2 to prevent electrical short circuits between these surfaces and the second interconnecting lines 10.

In the XYZ coordinate system shown in FIG. 1, the X axis is parallel to the direction in which the LEDs 11 are arrayed. The Y axis is parallel to the surface of the silicon substrate 2 and orthogonal to the X axis. The Z axis is orthogonal to both the X and Y axes.

The width W of the LED epi-film 3 in the Y-axis direction is slightly greater than the dimensions of the LEDs 11 and the electrode pads 9 in this direction. In FIG. 1, for example, if the width (d) of the LEDs 11 in the Y-axis direction is 15 μm and width (b) of the electrode pads 9 in this direction is likewise 15 μm, then to leave a gap (c) of 10 μm between the electrode pads 9 and the LEDs 11, a gap (a) of 10 μm between the electrode pads 9 and the edge 13 of the LED epi-film 3, and a gap (e) of 10 μm between the LEDs 11 and the opposite edge of the LED epi-film 3, the width (W) of the LED epi-film 3 should be 60 μm. This is much less than the conventional width of an LED array chip, which is, for example, about 400 μm.

The LED epi-film 3 is preferably formed from a purely epitaxial layer, as will be explained later. The LED epi-film 3 only has to be thick enough to give the LEDs 11 stable optical and electrical characteristics, and can be made as thin as, for example, 2 μm. This is much thinner than the conventional 300-μm thickness of an LED array chip.

The metal layer 4 is formed on the surface of the silicon substrate 2 in an area adjacent to the output areas 6 of the LED driving circuitry but not overlapping the LED driving circuitry. The functions of the metal layer 4 include both attachment of the LED epi-film 3 in a predetermined position near the integrated circuit area in the silicon substrate 2, and electrical contact with the LED epi-film 3 and the silicon substrate 2, the metal layer 4 thus serving as a common return electrode of the LEDs 11 in the LED epi-film 3. An electrical contact between the undersurface of the LED epi-film 3 and the surface of the silicon substrate 2 is necessary to enable the LED driving circuitry integrated into the silicon substrate 2 to drive the LEDs 11. Ohmic contacts are preferably formed between the metal layer 4 and the surfaces of the silicon substrate 2 and LED epi-film 3.

The LEDs 11 and the LED driving integrated circuits are thus electrically interconnected in two ways. Each LED 11 is connected through a first interconnecting line 8, an electrode pad 9, and a second interconnecting line 10 to the output area 6 of a driving circuit integrated into the silicon substrate 2, and all of the LEDs 11 are connected through the metal layer 4 to a common terminal area of the silicon substrate 2, which is connected to the driving circuitry, forming a circuit through which current can flow.

Before the LED epi-film 3 is attached to the silicon substrate 2, the first interconnecting lines 8 and their electrode pads 9 are formed by photolithography so that they constitute a single unit with the LED epi-film 3, the first interconnecting lines 8 making electrical contact (preferably, ohmic contact) with the light-emitting surfaces of the LEDs 11. After the LED epi-film 3 has been attached to the silicon substrate 2, the above-mentioned interlayer dielectric film is formed, and the second interconnecting lines 10 are formed on this dielectric film by, for example, depositing a thin metal film and patterning the film by photolithography.

Next, the dimensions of the interconnecting lines 8, 10 and electrode pads 9 will be described.

Each first interconnecting line 8 has a width $X_1$ at its first end and in the interconnecting part that interconnects the first end to the electrode pad 9 at the second end. The electrode pads 9 have a greater width $X_2$. The second interconnecting lines have a uniform width $X_3$ from their first ends to their second ends, the first ends being the ends making electrical contact with the interconnection pattern in the output areas 6, the second ends being the ends making electrical contact with the electrode pads 9.

For a high-resolution array with one thousand two hundred light-emitting diodes per inch (1200 dpi), for example, the LEDs 11 are disposed at intervals of 21.2 µm, each LED 11 occupying a space of, for example, about 10 µm. To minimize blockage of the light emitted by the LED 11, the dimension $X_1$ must be small, preferably as small as one to four micrometers (1–4 µm). This narrow dimension is not necessary, however, in the electrode pads 9 that make contact with the second interconnecting lines 10. The electrode pads 9 accordingly have a width $X_2$ greater than the width $X_1$ of the first interconnecting lines 8 in their interconnecting parts and at their first ends ($X_1 < X_2$). The width $X_2$ of the electrode pads 9 is also greater than the width $X_3$ of the second interconnecting lines 10 ($X_3 < X_2$).

When the LED epi-film 3 is attached to the silicon substrate 2, it cannot be positioned perfectly; a positioning tolerance of, for example ±2 µm must be allowed in the X direction with respect to the output areas 6 formed in the silicon substrate 2. When the first interconnecting lines 8, electrode pads 9, and second interconnecting lines 10 are formed by photolithography, some alignment error is also unavoidable. In the present embodiment the interconnecting lines 8, 10 and electrode pads 9 are aligned with a combined tolerance of, for example, +1 µm in the X direction.

If the width dimensions $X_1$, $X_2$, $X_3$ of the first interconnecting lines 8, the electrode pads 9, and the second interconnecting lines 10 were uniformly 4 µm, a total error of more than about 2 µm in the positions of the LED epi-film 3, first interconnecting lines 8, electrode pads 9, and second interconnecting lines 10 could prevent adequate electrical contact for driving the LEDs 11. This already uses up the positioning tolerance of the LED epi-film 3 with respect to the output areas 6, with no allowance for alignment error in the interconnecting lines 8, 10 and electrode pads 9.

In the present embodiment, however, the width $X_2$ of the electrode pads 9 exceeds the other width dimensions $X_1$, $X_3$ of the interconnecting lines 8, 10. In a high-resolution 1200-dpi array in which the LEDs 11 are formed at intervals of 21.2 µm, the width $X_2$ of the electrode pads 9 can be approximately 15 µm. If the widths $X_3$ of the second interconnecting lines are 4 µm, then a tolerance of ±4.5 µm (calculated as $X_2/2 - X_3/2$ – alignment tolerance of the interconnecting lines and electrode pads) can be allowed in the X-direction positioning of the LED epi-film 3 on the silicon substrate 2. This tolerance is more than double the actual positioning tolerance of 2 µm, so the LEDs 11 can be reliably connected to their driving circuits without concern about possible mis-positioning in the X-direction.

Figure 3:
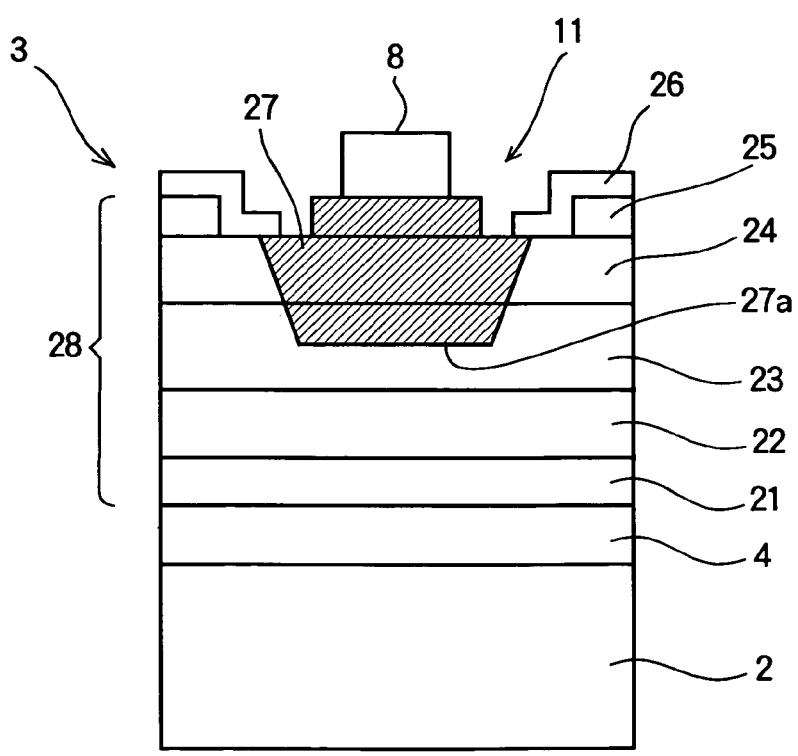
FIG. 3 is a schematic sectional view of an LED as seen through line B—B in FIG. 2.

The LEDs 11 will now be described with reference to the sectional view in FIG. 3, which shows the silicon substrate 2, the metal layer 4, and the various layers of an LED 11. These layers include the first interconnecting line 8 and an interlayer dielectric film 26. The interlayer dielectric film 26, which differs from the interlayer dielectric film mentioned above, insulates the first interconnecting line 8 from the semiconductor epitaxial layers 28 of the LED epi-film 3. The semiconductor epitaxial layers 28 are n-type semiconductor layers, except in a zinc diffusion area 27, as will be described later.

The term 'LED epi-film' refers basically to the semiconductor epitaxial layers 28, but in parts of the following description the LED epi-film will also be considered to include the interlayer dielectric film 26 and first interconnecting line 8, which are formed before the semiconductor epitaxial layers are removed from the GaAs substrate (not shown) on which they are formed.

The semiconductor epitaxial layers 28 comprise, from the bottom up, an n-type GaAs layer 21 and three n-type aluminum gallium arsenide (AlGaAs) layers: an $Al_xGa_{1-x}As$ lower cladding layer 22 ($0 \leq x \leq 1$), an $Al_yGa_{1-y}As$ active layer 23 ($0 \leq y \leq 1$), and an $Al_zGa_{1-z}As$ upper cladding layer 24 ($0 \leq z \leq 1$). A second n-type GaAs contact layer 25 is formed on the n-type $Al_zGa_{1-z}As$ layer 24 and then partially removed around the edges of the zinc diffusion area 27. The aluminum composition ratios x, y, z of the AlGaAs layers are preferably selected so that x>y and z>y (e.g., x=z=0.4, y=0.1), and the diffusion front of the zinc diffusion region 27 is preferably located within the n-type $Al_yGa_{1-y}As$ active layer active 23. The zinc diffusion area 27 is a p-type area, so a pn junction is formed at the boundary between it and the n-type parts of the semiconductor epitaxial layers 28. With this structure, minority carriers injected through the pn junction are confined within the n-type $Al_yGa_{1-y}As$ active layer 23 and the p-type $Al_yGa_{1-y}As$ region created therein by zinc diffusion, so that high luminous efficiency is obtained. The structure shown in FIG. 3 enables high luminous efficiency to be obtained with an LED epi-film 3 as thin as about 2 µm.

The semiconductor epitaxial layers 28 of the LED epi-film 3 may be formed by well-known techniques such as metal organic chemical vapor deposition (MOCVD) or molecular beam epitaxy (MBE).

In a variation of the present embodiment, the semiconductor epitaxial layers 28 of the LED epi-film 3 are attached to a non-conductive substrate such as a glass plate, instead of a silicon substrate 2, and the LED driver circuits are formed on the glass plate from polycrystalline silicon by a low-temperature growth process.

In the combined LED/driver IC chip 1 of the present embodiment, the LEDs and their driving circuits can be electrically interconnected with high reliability even if their relative positioning in the X-axis direction is only moderately accurate. As a result, the fabrication process is simplified and the quality of the completed combined LED/driver IC chip is improved. The material cost of the combined LED/driver IC chip is also reduced, because the semiconductor materials from which the LED array is fashioned are used more efficiently than in a convention LED array chip.

Second Embodiment

Figure 4A:
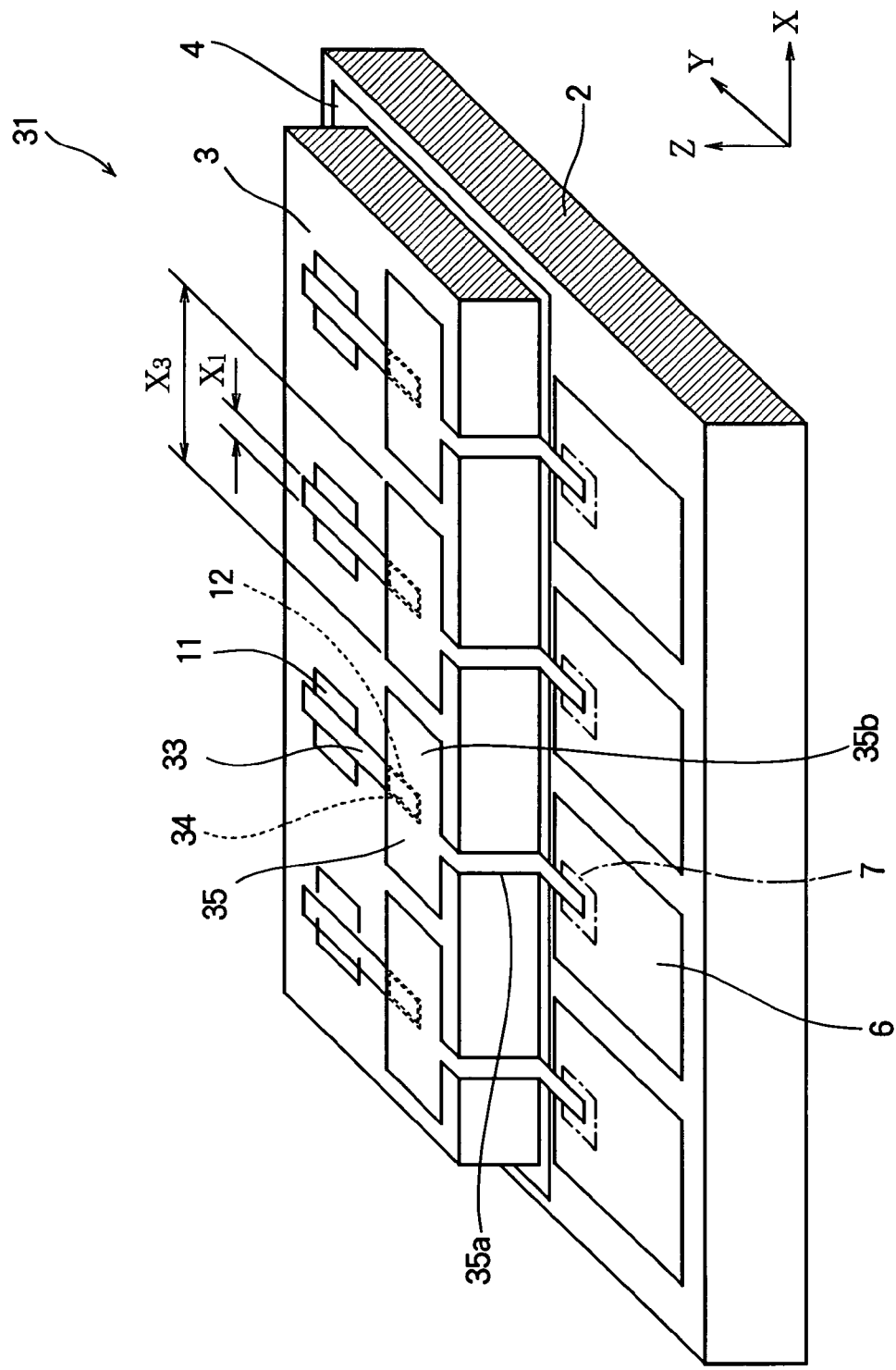
FIG. 4A is a perspective view schematically showing part of a combined LED/driver IC chip according to a second embodiment of the invention.

Referring to FIG. 4A, the second embodiment is identical to the first embodiment, except for the first interconnecting lines 33, their second ends 34, and the second interconnecting lines 35 (now including interconnecting line parts 35a and electrode pads 35b). The second embodiment will be described focusing on these elements.

The second ends 34 of the first interconnecting lines 33 in FIG. 4A have the same width $X_1$ as the first ends and interconnecting parts of the interconnecting lines 33. In the second interconnecting lines 35, the electrode pads 35b have a width $X_3$ larger than width $X_1$. The interconnecting parts 35a of the second interconnecting lines 35 are formed continuously with the electrode pads 35b but are narrower than the electrode pads 35b and are connected to the output area 6.

Although the second embodiment widens the second ends of the second interconnecting lines 35 instead of the second ends 34 of the first interconnecting lines 33, the effect is the same as in the first embodiment: an adequate positioning margin is provided in the X-axis direction, and reliable electrical interconnections between the LED epi-film 3 and the output areas 6 of the driving circuitry in the silicon substrate 2 are formed even if their relative positioning is only moderately accurate in the X-axis direction.

Figure 4B:
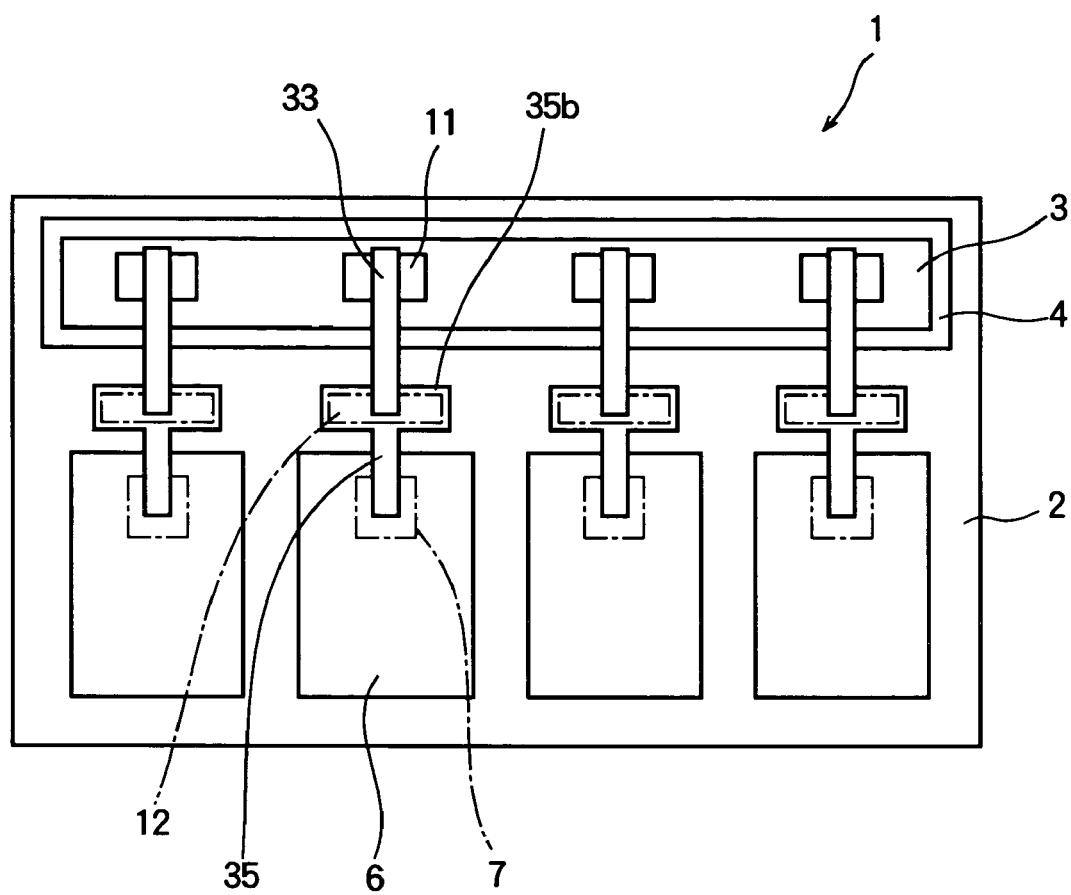
FIG. 4B is a plan view schematically showing part of a combined LED/driver IC chip according to a variation of the second embodiment.

Referring to FIG. 4B, in a variation of the second embodiment, the electrode pads 35b of the second interconnecting lines 35 are disposed on the silicon substrate 2 instead of the LED epi-film 3. The first interconnecting lines 33 extend from the LEDs 11 in the LED epi-film 3 to the electrode pads 35b of the second interconnecting lines 35, and make electrical contact with the electrode pads 35b through contact holes 12 in an interlayer dielectric film (not explicitly shown) that insulates the first interconnecting lines 33 from the surfaces of the LED epi-film 3 and silicon substrate 2.

This variation has the advantage of permitting the size of the LED epi-film 3 to be further reduced, since the LED epi-film only has to accommodate the LEDs and does not have to accommodate the electrode pads.

A similar variation is possible in the first embodiment: the electrode pads 9 shown in FIG. 1 may be located on the silicon substrate 2, enabling the size of the LED epi-film 3 to be reduced.

Third Embodiment

Figure 5:
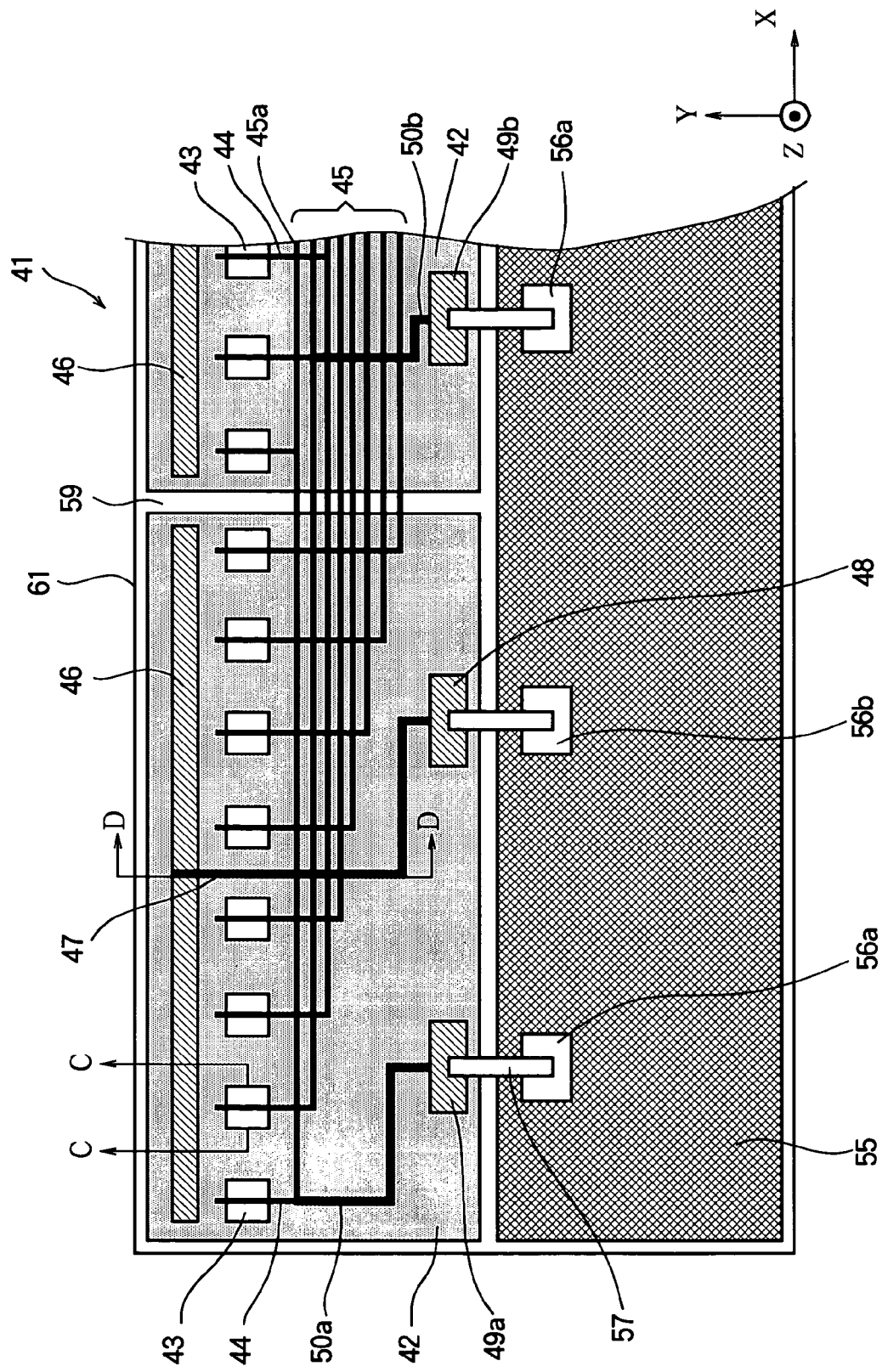
FIG. 5 is a plan view schematically showing the structure of a combined LED/driver IC chip according to a third embodiment.
Figure 6:
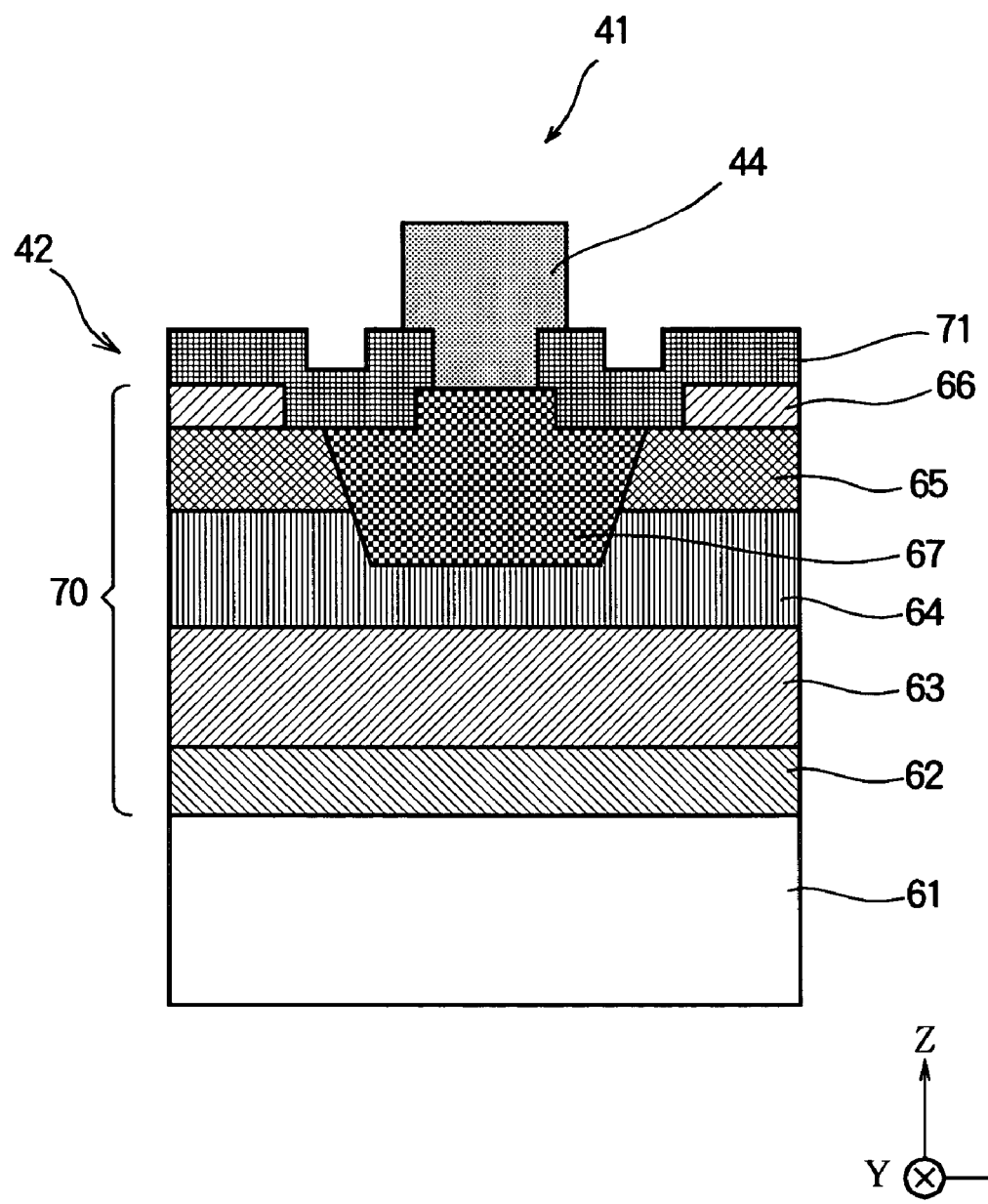
FIG. 6 is a schematic sectional view of part of the combined LED/driver IC chip as seen through line C—C in FIG. 5.
Figure 7:
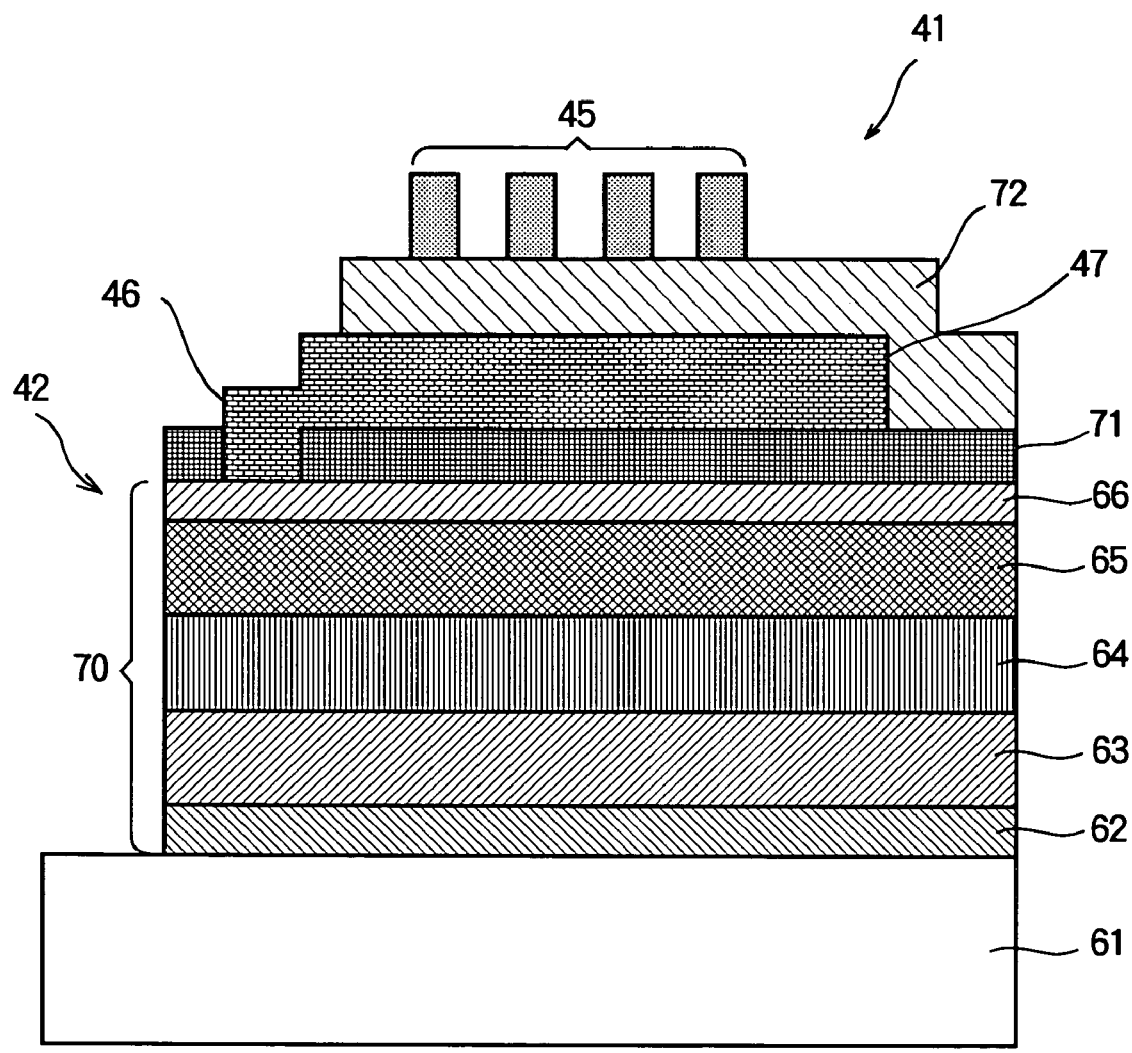
FIG. 7 is a schematic sectional view of the combined LED/driver IC chip as seen through line D—D in FIG. 5.

The third embodiment is illustrated in FIGS. 5, 6, and 7. In the XYZ coordinate system in these drawings, as in the preceding embodiments, the X axis is parallel to the direction in which the LEDs 43 are arrayed, the Y axis is parallel to the surface of the silicon substrate 61 and orthogonal to the X axis, and the Z axis is orthogonal to the X and Y axes.

Referring to FIG. 5, the third embodiment has a plurality of unit LED epi-films 42, each including m LEDs 43, where m is an integer greater than one, preferably greater than two. The LEDs 43 are disposed at regular intervals in a single linear array extending across the plurality of unit LED epi-films 42. Each LED 43 is electrically connected to an individual electrode 44. Each individual electrode 44 is electrically connected to one of m transverse interconnecting lines 45 that extend across the unit LED epi-films 42. Each unit LED epi-film 42 includes a common electrode 46, which is electrically connected via a common interconnecting line 47 to an electrode pad 48 and functions as a common return electrode, as described below.

In this embodiment, there are eight LEDs 43 per unit LED epi-film 42 and eight transverse interconnecting lines 45 (m=8), but the invention is not limited to this number.

A plurality of electrode pads 49 (identified as electrode pad 49a, 49b, . . . ) are formed corresponding to the plurality of transverse interconnecting lines 45, and are electrically connected via interconnecting leads 50 (identified as interconnecting lead 50a, 50b, . . . ) to the transverse interconnecting lines 45. LED driving circuits for the LEDs 43 are formed in the integrated driving circuit area 55; this area includes individual electrode areas 56a formed as terminal pad regions in a wiring layer above the driving terminals of the LED driving circuits. (The LED driving circuits and their wiring are not explicitly shown.) The individual electrode areas 56a are electrically connected to the electrode pads 49a, 49b, . . . via corresponding second interconnecting lines 57; a common electrode area 57b, also formed as a terminal pad region, is electrically connected via a corresponding second interconnecting line 57 to each electrode pad 48.

In this embodiment, the individual electrodes 44, transverse interconnecting lines 45, interconnecting leads 50, and electrode pads 49 constitute a set of m branched interconnecting lines, each having n first ends (individual electrodes 44, n being the number of unit LED epi-films 42), one second end (electrode pad 49), and an interconnecting part (transverse interconnecting line 45 and interconnecting lead 50) interconnecting the first ends to the second end. The common electrodes 46, interconnecting lines 47, and electrode pads 48 constitute n common interconnecting lines each having a first end (common electrode 46), at least one second end (electrode pad 48), and an interconnecting part (interconnecting line 47) interconnecting the first and second ends.

The unit LED epi-films 42 are electrically isolated from one another by isolation trenches 59.

Each transverse interconnecting line 45 is electrically connected by individual electrodes 44 to LEDs 43 in corresponding positions in each unit LED epi-film 42. For example, transverse interconnecting line 45a is electrically connected to the leftmost LED 43 in each unit LED epi-film 42 in the drawing. Each transverse interconnecting line 45 is also connected to an electrode pad 49. For example, transverse interconnecting line 45a is connected by interconnecting lead 50a to the electrode pad 49a in the leftmost unit LED epi-film 42 in the drawing.

Each common electrode 46 makes electrical contact with a semiconductor layer in the unit LED epi-film 42 that is electrically continuous with all of the LEDs 43 in the unit LED epi-film 42. The common electrode 46 accordingly provides an electrical path from the LEDs 43 via the common interconnecting line 47 to the electrode pad 48 located in each unit LED epi-film 42.

As there are n unit LED epi-films 42, there are m×n LEDs 43. The driving circuits in the integrated driving circuit area 55 can drive the m×n LEDs 43 by supplying driving signals to only m+n electrode pads 48, 49.

The widths of the electrode pads 48, 49 in the X-axis direction exceed the widths of the second interconnecting lines 57 by at least a margin sufficient to allow the necessary tolerances in the patterning accuracy of the second interconnecting lines 57 and the relative positioning accuracy of the unit LED epi-films 42 and integrated driving circuit area 55, but preferably not by much more than this necessary margin, because the smaller the size of the electrode pads is, the less parasitic capacitance they have.

The individual electrodes 44, transverse interconnecting lines 45, and common interconnecting lines 47 are formed in two layers, the transverse interconnecting lines 45 being separated from the individual electrodes 44 and common interconnecting lines 47 by an interlayer dielectric film. For example, the common electrodes 46, common interconnecting lines 47, electrode pads 48, electrode pads 49, and interconnecting leads 50 may be formed in a first layer of electrodes and interconnection wiring, and the transverse interconnecting lines 45 may be formed in a second layer of electrodes and interconnection wiring.

FIG. 6 shows a sectional view through one of the LEDs 43 in a unit LED epi-film 42. The unit LED epi-film 42 rests on the surface of the silicon substrate 61, with no intervening metal film. The unit LED epi-film 42 comprises, from the bottom up, a GaAs layer 62, an $Al_xGa_{1-x}As$ lower cladding layer 63, an $Al_yGa_{1-y}As$ active layer 64, an $Al_zGa_{1-z}As$ upper cladding layer 65, and a GaAs contact layer 66, these layers being epitaxial semiconductor layers 70. Composition parameters x and z are preferably both greater than composition parameter y, so that the bandgap energy of the two cladding layers 63, 65 is greater than the bandgap energy of the active layer 64. All of the epitaxial semiconductor layers 70 are n-type layers, except in a p-type impurity diffusion region 67 doped with a zinc impurity. The GaAs contact layer 66 is partly removed around the edges of the impurity diffusion region 67. The GaAs contact layer 66 is covered by a first interlayer dielectric film 71, which is partly removed to permit electrical contact between the individual electrode 44 and the GaAs contact layer 66 in the impurity diffusion region 67. The unit LED epi-film 42 is considered to include the first interlayer dielectric film 71 and individual electrode 44, which are formed before the epitaxial semiconductor layers 70 are transferred from their original GaAs substrate to the silicon substrate 61, as described later.

FIG. 7 shows a sectional view aligned with the common interconnecting line 47 in a unit LED epi-film 42. The epitaxial semiconductor layers 70 have the structure described above. A window in the first interlayer dielectric film 71 enables the entire common electrode 46 to make electrical contact with the GaAs contact layer 66. The common interconnecting line 47 extends from the common electrode 46 over the surface of the first interlayer dielectric film 71, which insulates the common interconnecting line 47 from the epitaxial semiconductor layers 70. A second interlayer dielectric film 72 is formed on the first interlayer dielectric film 71, covering the common interconnecting line 47. The transverse interconnecting lines 45 are formed on the surface of the second interlayer dielectric film 72, which insulates them from the common interconnecting line 47. For simplicity, FIG. 7 shows only four transverse interconnecting lines 45, although the actual number is eight as shown in FIG. 5.

Figure 8:
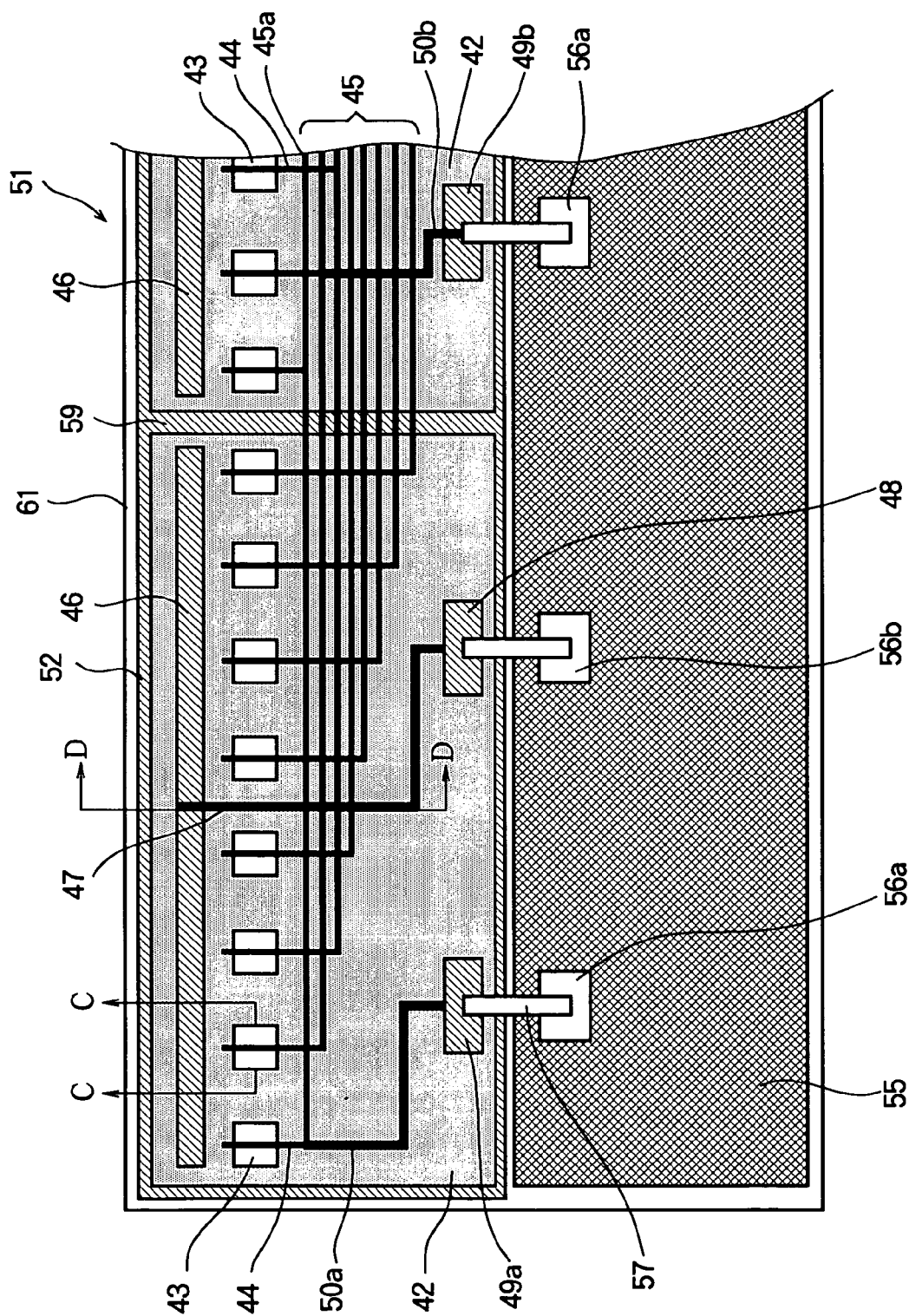
FIG. 8 is a plan view schematically showing part of a variation of the combined LED/driver IC chip in FIG. 5.

FIG. 8 shows a variation of the third embodiment. The combined LED/driver IC chip 51 in FIG. 8 differs from the combined LED/driver IC chip 41 in FIG. 5 in having a metal layer 52 for bonding the unit LED epi-film 42 to the silicon substrate 61. The metal layer 52 may be, for example, a single-layer gold film, a multi-layer film with titanium, platinum, and gold layers (a Ti/Pt/Au film), a multi-layer film with gold and zinc layers (an Au/Zn film), a multi-layer film with gold and germanium layers (an Au/Ge film), a multi-layer film with nickel and gold layers (an Ni/Au film), a single-layer aluminum film, a multi-layer film with aluminum and nickel layers (an Al/Ni film), a single-layer palladium film, a multi-layer film with palladium and gold layers (a Pd/Au film), a multilayer film with magnesium and gold layers (an Mg/Au film), or a multilayer film combining two or more of the above. Alternatively, the film may be a non-metallic conductive film, e.g., a polycrystalline silicon (polysilicon) film, or a thin, electrically conductive oxide film such as an indium tin oxide (ITO) film or a zinc oxide (ZnO) film.

Next a method of fabricating the combined LED/driver IC chip 41 shown in FIG. 5 will be described. The fabrication steps are illustrated in FIGS. 9 to 13. These steps are normally used to fabricate a plurality of chips on a silicon wafer, but here the fabrication of only one chip is shown.

Figure 9:
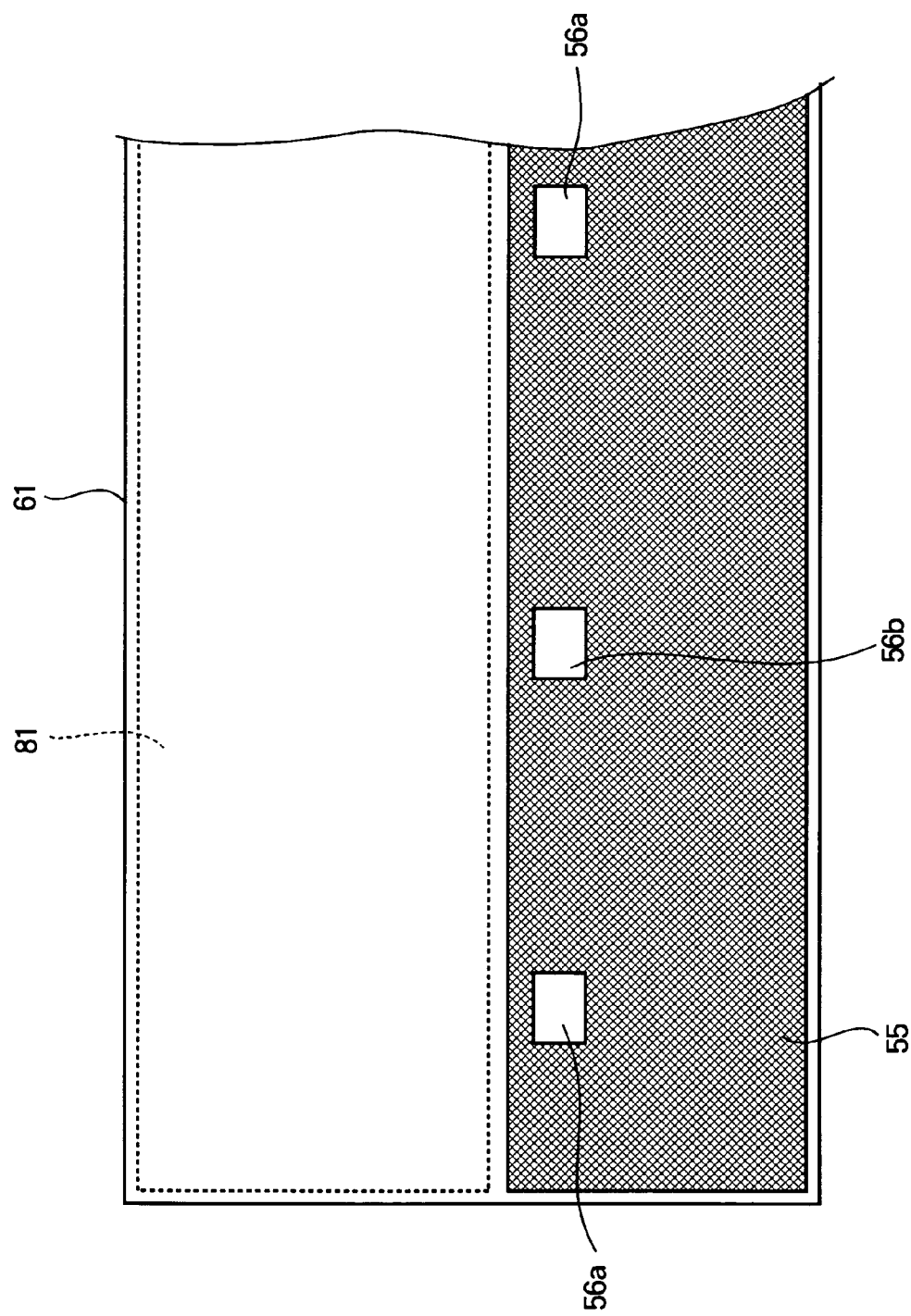
FIGS. 9, 10, 11, 12, and 13 are sectional views schematically showing steps in a fabrication process for the combined LED/driver IC chip in the third embodiment.

First, integrated driving circuitry is formed in the integrated driving circuit area 55 on the silicon substrate 61, as shown in FIG. 9. The integrated driving circuit area 55 includes individual electrode areas 56a and common electrode areas 56B, arranged in designated positions. The silicon substrate 61 has a bonding area 81 to which an LED epi-film 82 is bonded before the LED epi-film 82 is separated into the unit LED epi-films 42 described above.

Figure 10:
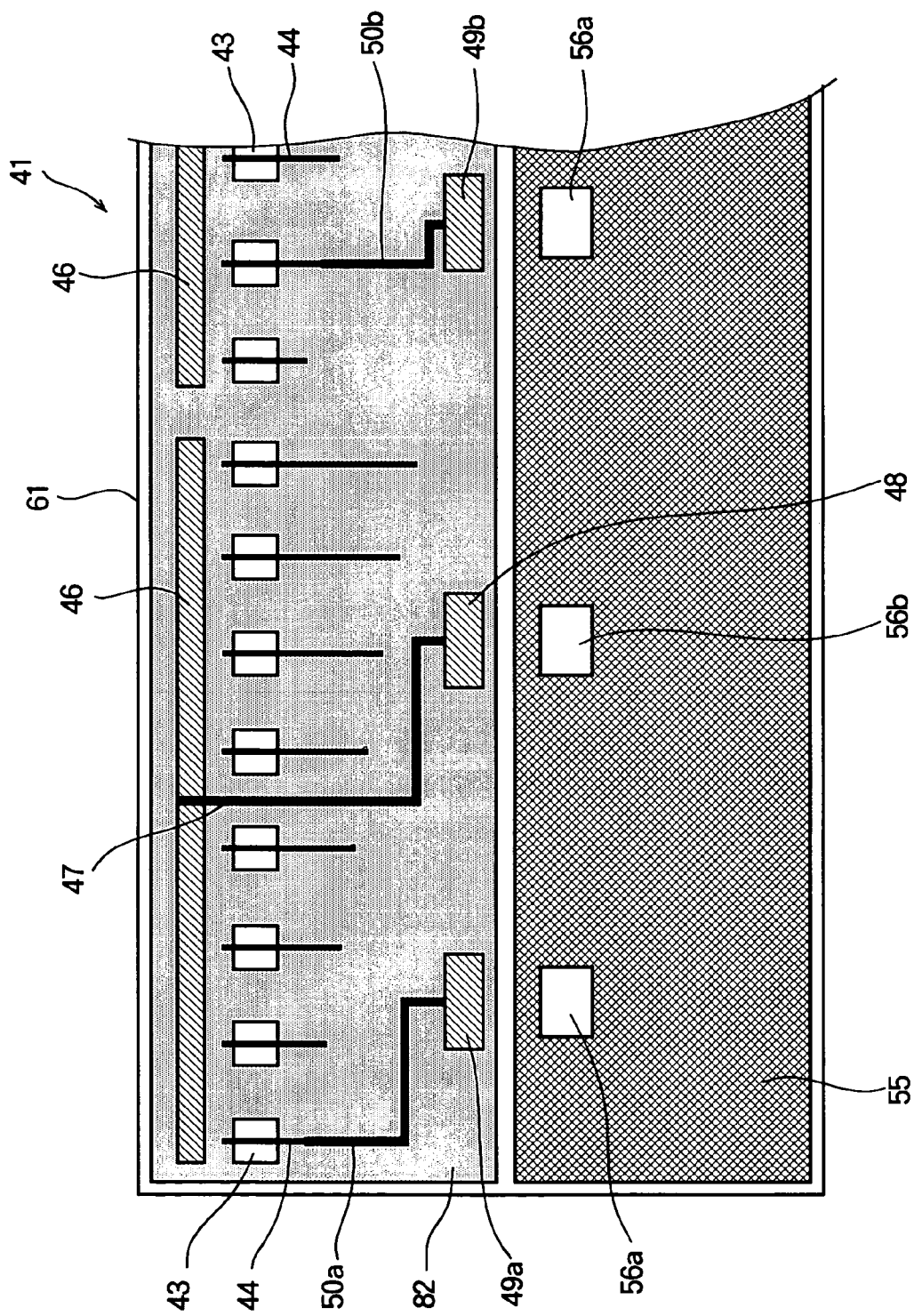

FIG. 10 shows the fabrication process at the stage in which the LED epi-film 82 has been bonded to the bonding area 81 adjacent the integrated driving circuit area 55, but has not yet been divided into individual unit LED epi-films 42. The fabrication and bonding of the LED epi-film 82 will be described in more detail later. The LED epi-film 82 at this stage includes a first layer of electrode and interconnection patterns comprising the individual electrodes 44, common electrodes 46, common interconnecting lines 47, electrode pads 48, electrode pads 49, and interconnecting leads 50.

Figure 11:
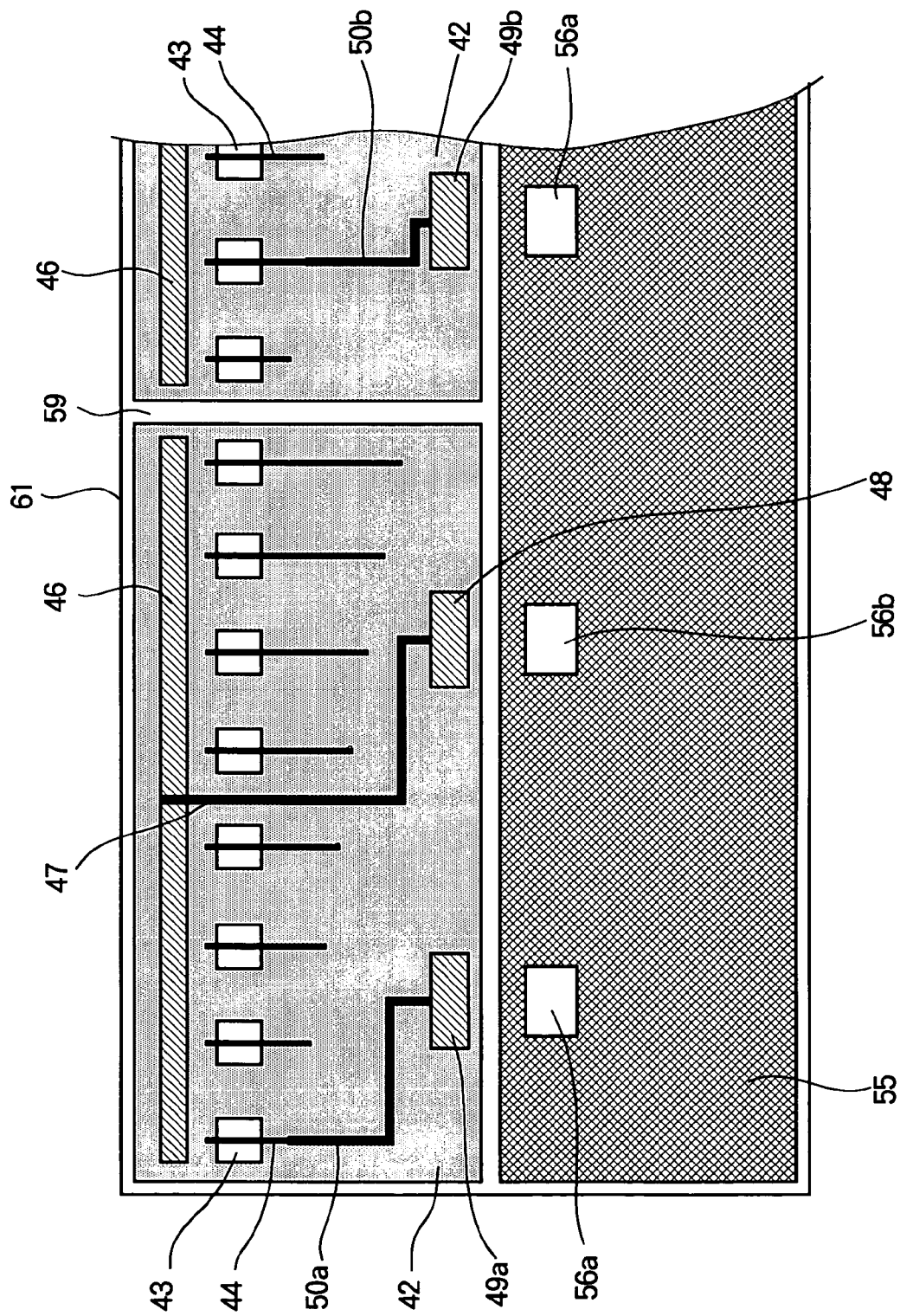

Next the LED epi-film 82 is divided into unit LED epi-films 42 as shown in FIG. 11. More specifically, the LED epi-film 82 is patterned by well-known photolithography and etching processes to form the isolation trenches 59. An etching solution of phosphoric acid, hydrogen peroxide, and distilled water may be used.

Figure 12:
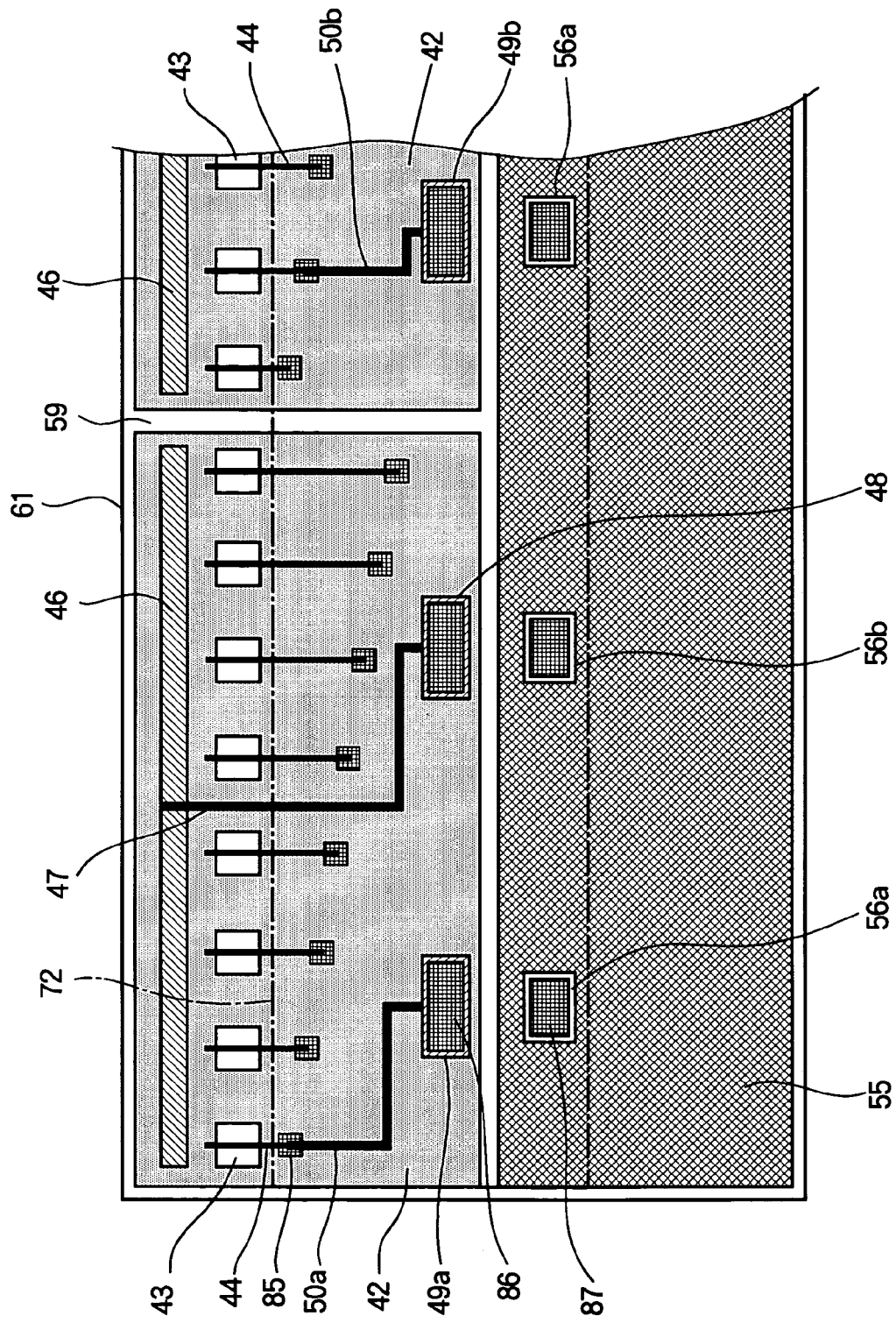

Next as shown in FIG. 12, the second interlayer dielectric film 72 (the outline of which is indicated by a dotted line) is formed in an area including at least the area where the first layer of electrode and interconnection patterns will intersect the second layer of electrode and interconnection patterns and the area in which the electrode pads 48 and 49 in the unit LED epi-film 42 will be connected with the individual electrode areas 56a and 56b. The second interlayer dielectric film 72 also has contact holes 85 for connecting the individual electrode 44 to the transverse interconnecting lines 45 (FIG. 5), contact holes 86 for connecting the electrode pads 48, 49 to the second interconnecting lines 57 (FIG. 5), and contact holes 87 for connecting the second interconnecting lines 57 to the individual electrode areas 56a and common electrode areas 57b in the integrated driving circuit area 55.

The first interlayer dielectric film 71 and the second interlayer dielectric film 72 may be silicon nitride films, silicon oxide films, polyimide films, or other applicable dielectric films. These inter-layer films fill the spaces between the unit LED epi-films 42 and the spaces between the unit LED epi-films 42 and the integrated driving circuit area 55. The thicknesses of these dielectric films and their coverage of the spaces are preferably adjusted so as to avoid breakage of interconnecting lines that cross the spaces.

Figure 13:
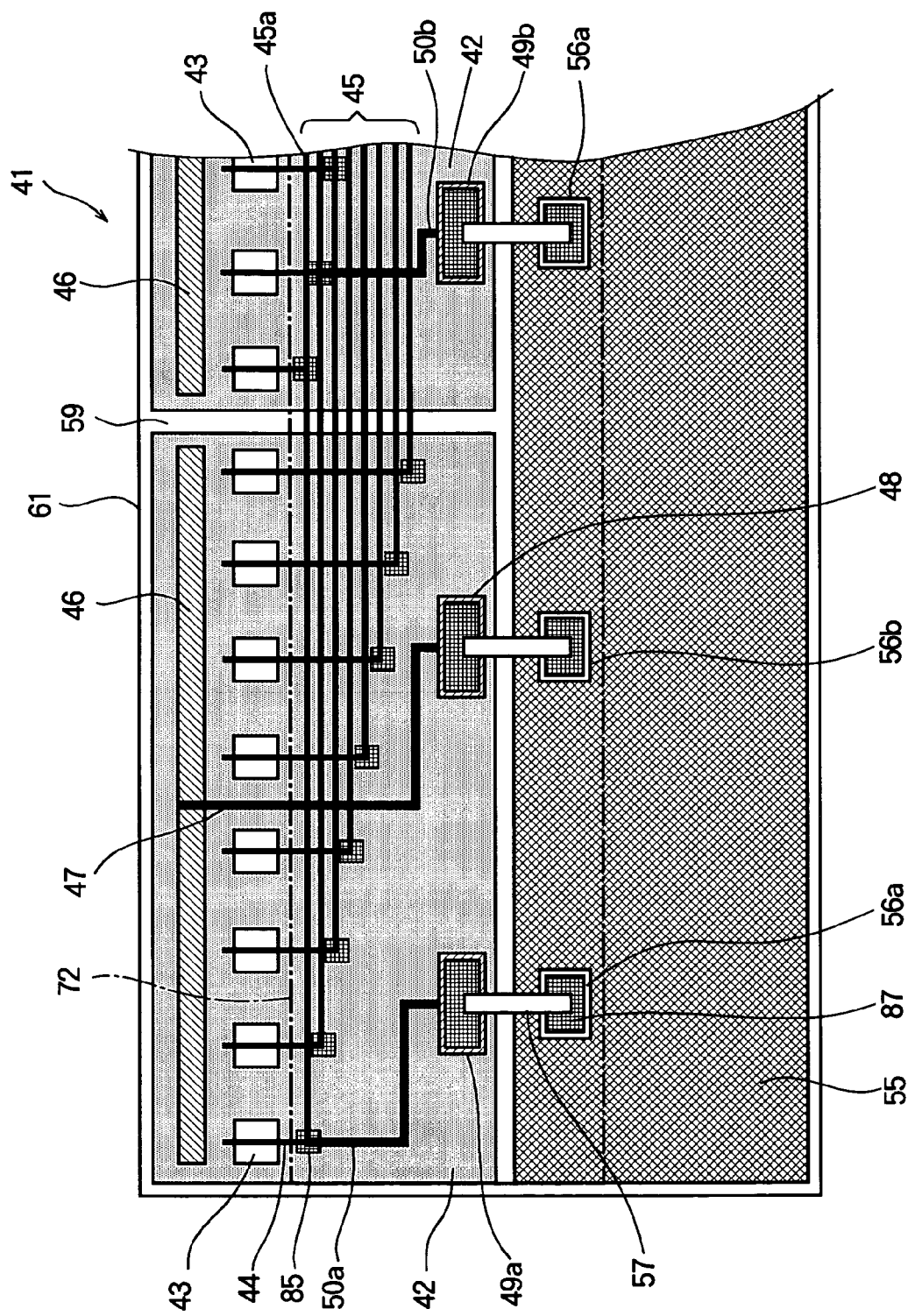

The transverse interconnecting lines 45 and second interconnecting lines 57 are formed on the second interlayer dielectric film 72 as shown in FIG. 13. The transverse interconnecting lines 45 connect via the contact holes 85 to the individual electrodes 44; the second interconnecting lines 57 interconnect the electrode pads 49 and individual electrode areas 56a via the contact holes 86, and interconnect the electrode pads 48 and common electrode areas 57b via the contact holes 87. This fabrication step can be carried out by the well-known lift-off method commonly used to form metal wiring.

Next, referring to FIGS. 14 to 17, a method of fabricating and bonding the LED epi-film 82 (FIG. 10) before it is divided into unit LED epi-films 42 (FIG. 5) will be described. In this method, a plurality of LED epi-films 82 are formed simultaneously on a single GaAs substrate 91.

Figure 14:
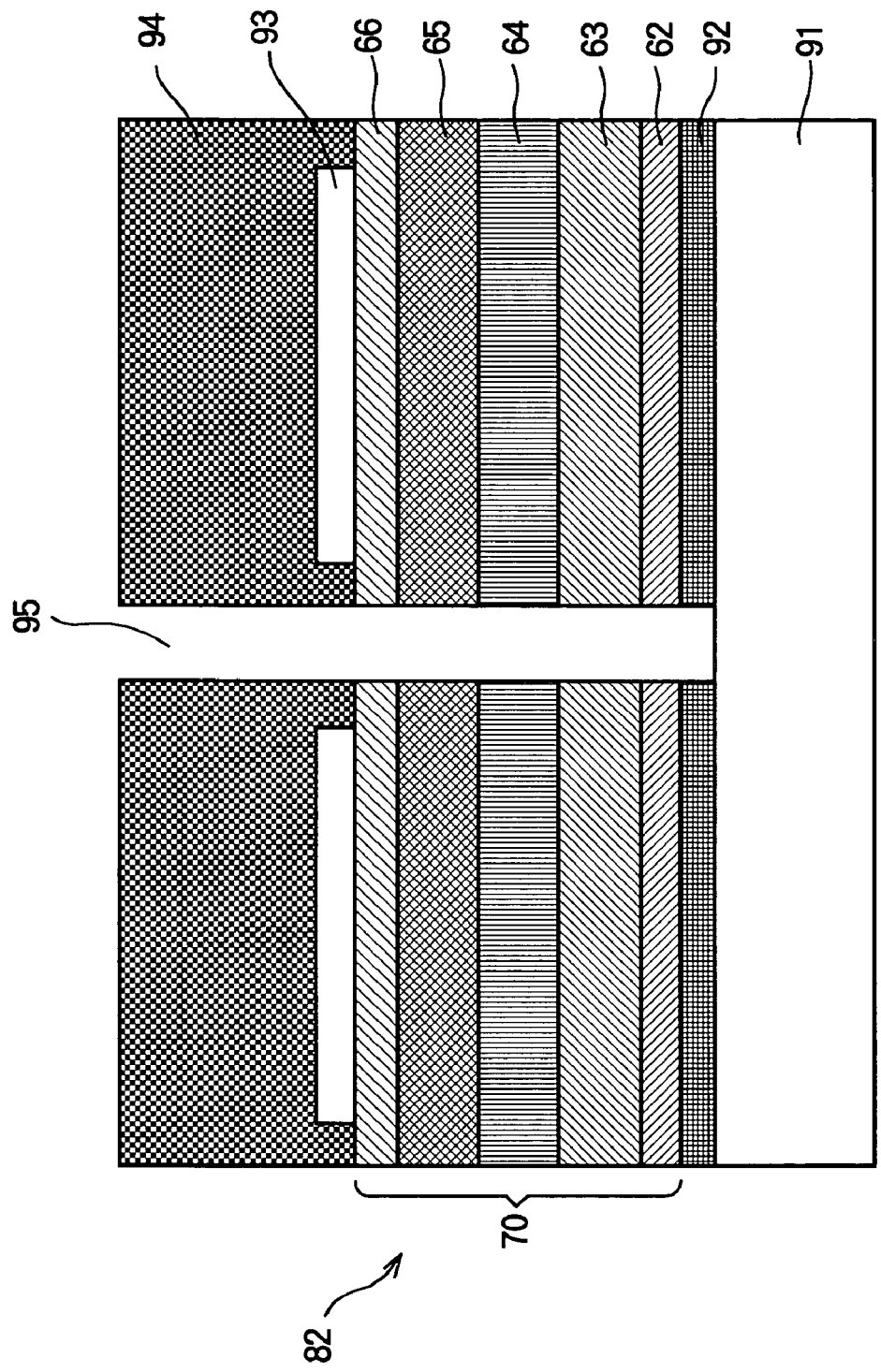
FIGS. 14, 15, 16, and 17 are sectional views schematically showing steps in a fabrication and bonding process for an LED epi-film.

Formation of the LED epi-films 82 is preceded by formation of a separation layer 92, shown in FIG. 14, that will be used to delaminate the completed LED epi-films 82. The epitaxial semiconductor layers 70 that constitute the LED epi-films 82 are formed on the separation layer 92. The first electrode and wiring pattern 93, comprising the individual electrodes 44, common electrodes 46, common interconnecting lines 47, electrode pads 48, electrode pads 49, interconnecting leads 50, and the first interlayer dielectric film 71 (FIGS. 6 and 7), is formed above the epitaxial semiconductor layers 70. The separation layer 92 may be a layer of aluminum arsenide (AlAs).

Although an LED epi-film is, strictly speaking, a semiconductor epitaxial layer, the term is also used herein to include the interconnecting structure and interlayer dielectric films that are formed before the semiconductor epitaxial layer is delaminated from its mother substrate, as noted above. In FIGS. 14 to 17, the term 'LED epi-film' refers to the epitaxial semiconductor layers 70 and the first interlayer dielectric, interconnection, and electrode layers 93.

The uppermost layer in FIG. 14 comprises supporting members 94, which are deposited to facilitate handling of the LED epi-films 82 when they are delaminated from the GaAs substrate 91. The supporting members 94 may be deposited on the epitaxial semiconductor layers 70 and the first interlayer dielectric, interconnection, and electrode layers 93 as a single layer, which is then patterned by forming grooves 95 extending down to the GaAs substrate 91, the isolation grooves 95 also dividing the epitaxial semiconductor layers 70 and the first interlayer dielectric, interconnection, and electrode layers 93 into individual LED epi-films 82 as shown in FIG. 14. The structure of the epitaxial semiconductor layers 70 in each LED epi-film 82 is the same as shown in FIGS. 6 and 7.

Before the grooves 95 are formed, the fabrication process should have been completed through the step of forming the first interlayer dielectric, interconnection, and electrode layers 93. In particular, the step of doping impurities to form the impurity diffusion regions 67 (FIG. 6) by diffusion should be completed, because this step requires high temperature annealing and cannot be carried out after the LED epi-film 82 is bonded to the bonding area 81 near the integrated driving circuit area 55 on the silicon substrate 61 shown in FIG. 9 without damage to the integrated circuitry.

The layout of the LEDs 43 (FIG. 8) is determined when the impurity diffusion regions 67 are formed by selective diffusion of zinc. The selective diffusion process may be carried out by solid phase diffusion. An exemplary process for forming the LEDs may include a step of forming a diffusion mask film with apertures corresponding to areas where the LEDs will be formed on the GaAs contact layer 66, a step of depositing a zinc diffusion source film and a cap film on the diffusion mask film, a step of annealing the substrate in a high temperature annealing oven to cause the zinc to diffuse into the substrate, and a step of removing the cap film and the diffusion source film by etching.

After the impurity diffusion regions 67 have been formed, the pn junction in at least the GaAs contact layer 66 and a region surrounding this pn junction are etched away, as shown in FIG. 6, and the first interlayer dielectric film 71 is formed to prevent short circuits between the p-type and n-type regions and overlying interconnection wiring. Then the first electrode and wiring pattern comprising the individual electrodes 44, common electrodes 46, common interconnecting lines 47, electrode pads 48, 49, and interconnecting leads 50 in FIG. 10 are formed. One example of a material applicable for forming the common electrodes 46, common interconnecting lines 47, and electrode pad 48, 49 is a gold-based metal.

Then the supporting members 94 are formed from, for example, a resist material. This material is preferably deposited on the whole surface of the LED epi-films 82 to prevent the LED epi-films 82 from being damaged by the etching fluid used to delaminate the LED epi-films 82 from the GaAs substrate 91. The material from which the supporting members 94 are formed should therefore have sufficient adhesion and thickness to protect the LED epi-films 82 from penetration by the etching fluid from above and from the sides.

Figure 15:
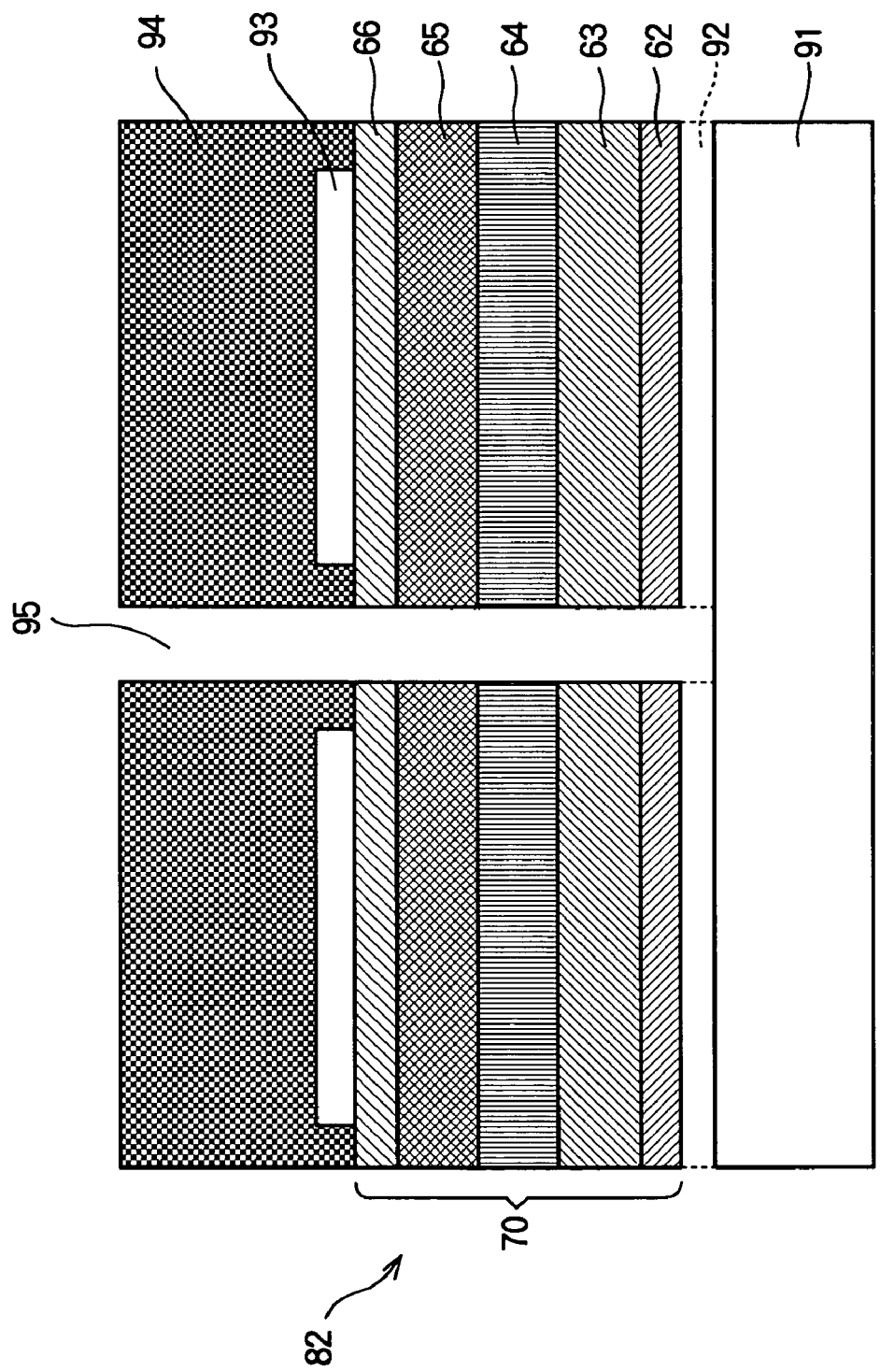

Next, as shown in FIG. 15, the LED epi-film 82 is delaminated from the GaAs substrate 91 by using an etching fluid such as a dilute solution of hydrofluoric acid (HF) that selectively etches the separation layer 92, substantially without etching the LED epi-film 82.

Figure 16:
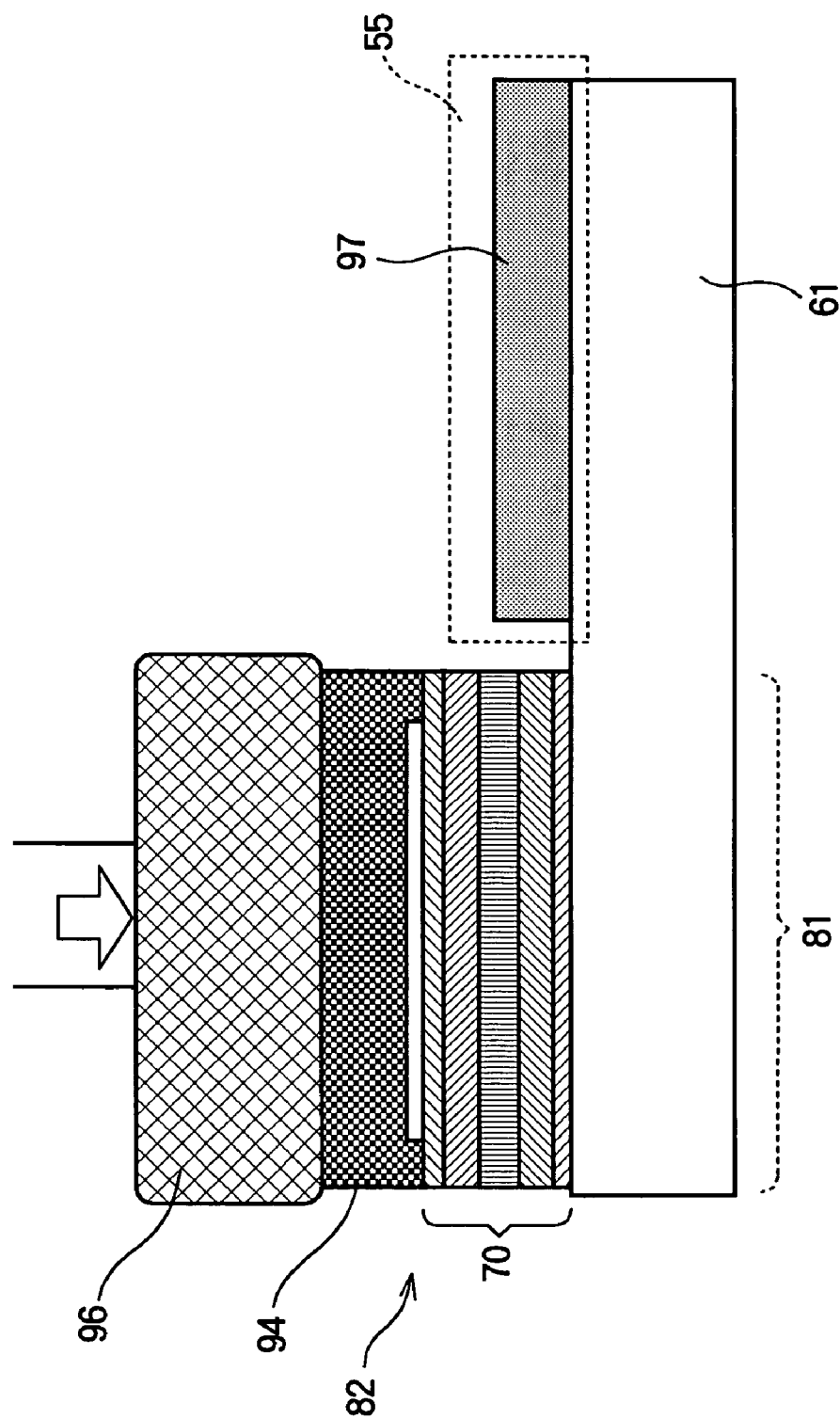

After the etching of the separation layer 92, the LED epi-films 82 are thoroughly rinsed with water; then each LED epi-film 82 is bonded to the bonding area 81 of a silicon substrate 61 as shown in FIG. 16. A tool such as the vacuum gripper 96 shown in FIG. 16 is used to position each part of the LED epi-film 82 so that it faces the corresponding driving circuited integrated into the integrated driving circuit area 55 in the silicon substrate 61. The bonding is accomplished by a combination of heat and pressure that provides adequate bonding strength. It is advisable to cleanse the bonding surface of dust and contamination layers before bonding. FIG. 16 also shows a multilayer interconnection structure 97 that is present in the integrated driving circuit area 55; the multilayer interconnection structure 97 includes the individual electrode areas 56*a* and the common electrode areas 57*b*.

Figure 17:
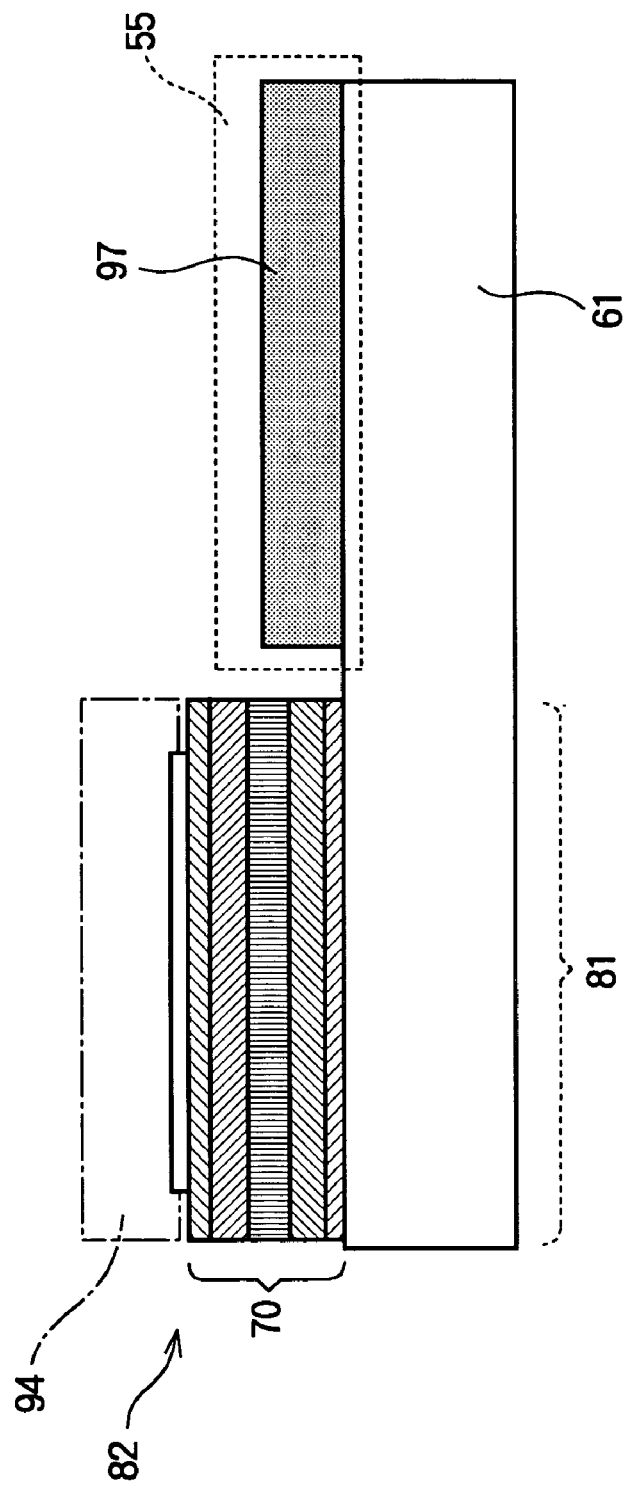

Finally, the supporting member 94 is removed as shown in FIG. 17 to complete the bonding of the LED epi-film 82. The supporting member 94 can be removed by using resist stripping fluid, for example.

As described above, in the combined LED/driver IC chip of the third embodiment, a common electrode pad 48 is provided for each of the unit LED epi-films 42; the individual electrode 44 of each LED is confined to one unit LED epi-film 42, but is electrically interconnected to a transverse interconnecting line 45 that leads to an electrode pad 49, which may be disposed in any of the unit LED epi-films 42. The electrode pads 48, 49 are electrically interconnected via the second interconnecting lines to the driving integrated circuitry. As a result, the combined LED/driver IC chip in this embodiment produces the following effects, in addition to the effect produced in the first embodiment.

The matrix interconnection scheme used in the third embodiment enables m×n LEDs to be driven from just m+n electrode pads. This scheme can reduce the number of interconnection wires needed for electrical interconnections between the LEDs and their driving circuitry to a relatively small number, even when a large number of LEDs must be driven. This makes the formation of the interconnection wiring easier, and also reduces the probability of faulty wiring. In addition, the number of final driver stages in the driving integrated circuitry can be reduced, and the width of the area occupied by this circuitry can be reduced correspondingly.

In a variation of the third embodiment, the electrode pads 48, 49*a*, 49*b*, . . . are disposed on the silicon substrate 61 instead of on the unit LED epi-films 42.

Fourth Embodiment

Figure 18:
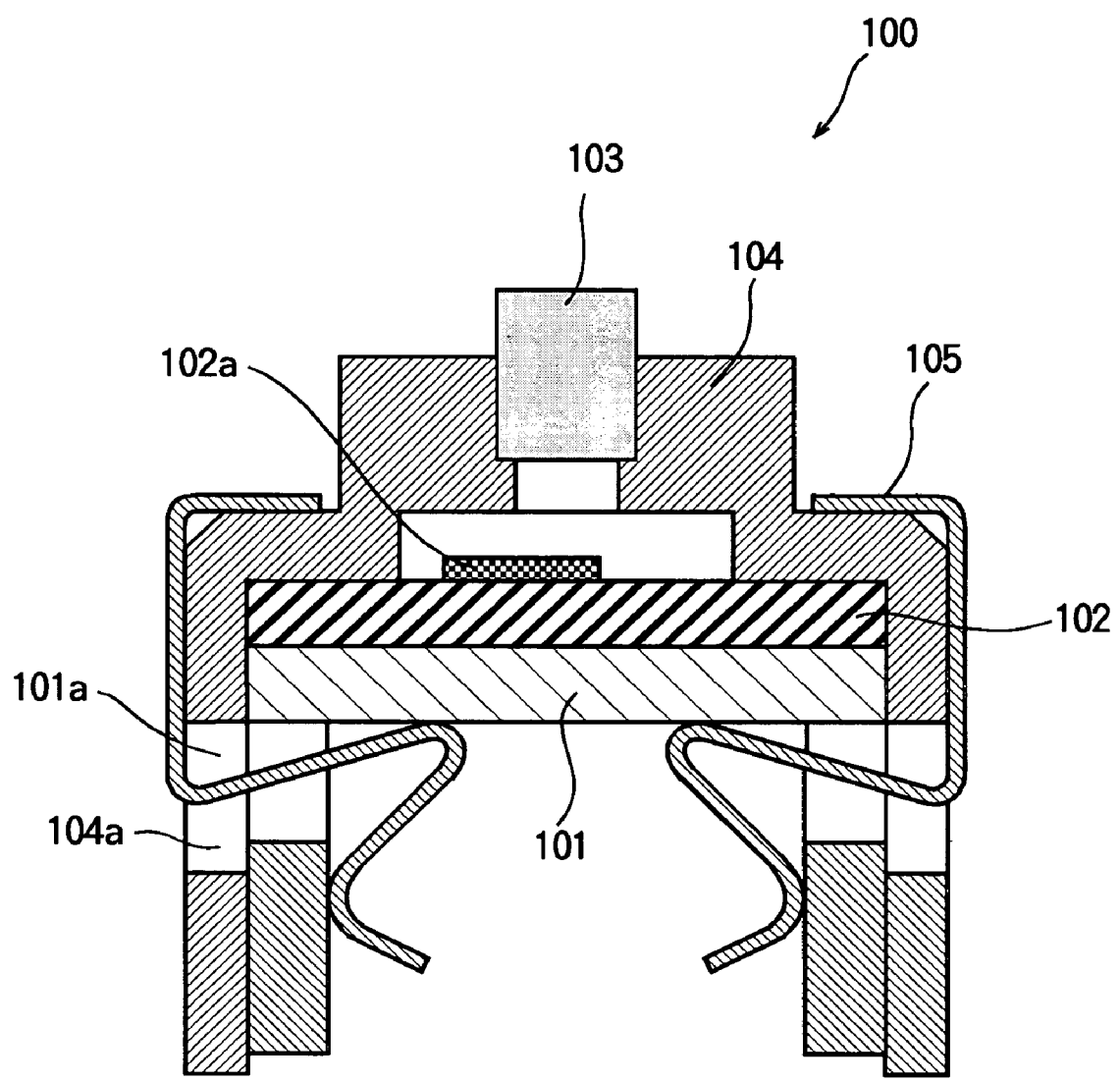
FIG. 18 is a sectional view schematically showing an LED print head according to a fourth embodiment of the invention.
Figure 19:
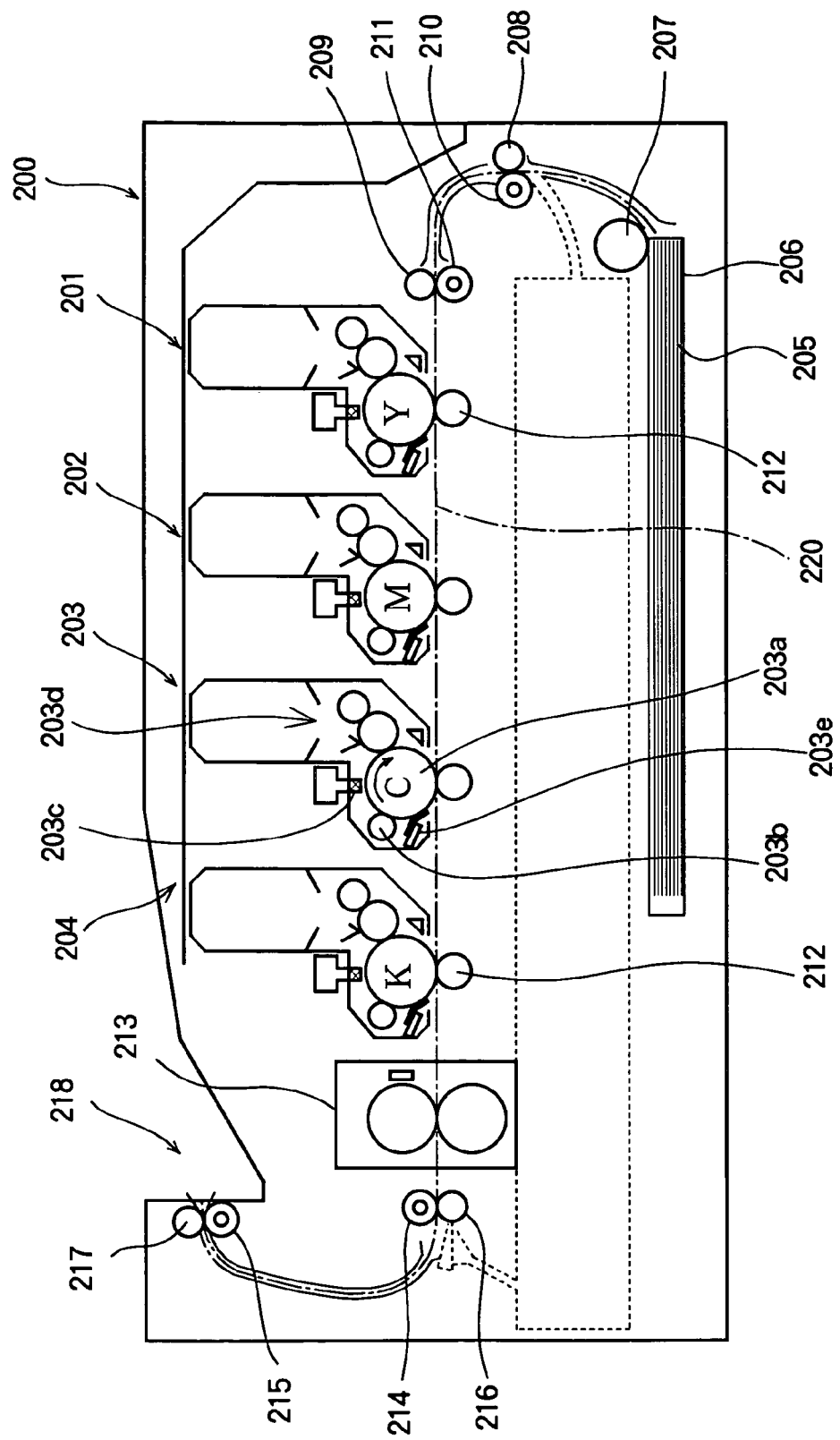
FIG. 19 is a sectional view schematically showing an image forming apparatus according to a fifth embodiment of the invention.

The present invention can also be embodied in an LED print head. Referring to FIG. 18, the LED print head 100 includes a base 101 on which an LED unit 102 is mounted. The LED unit 102 includes one or more combined LED/driver IC chips 1, 31, 41, 51 of the type described in any of the first three embodiments, mounted so that their light-emitting parts 102*a* are positioned beneath a rod lens array 103. The light-emitting parts 102*a* correspond to, for example, the LED epi-film 3 in the first or second embodiment, or the unit LED epi-films 42 in the third embodiment, in which case the combined LED/driver IC corresponds to the entire LED nit 102. Alternatively, the combined LED/driver ICs may correspond to the light-emitting part 102a of the LED unit 102, which comprises a printed circuit board on which the combined LED/driver ICs are mounted.

The rod lens array 103 is supported by a holder 104. The base 101, LED unit 102, and holder 104 are held together by clampers 105 that extend through openings 101a, 104a in the base 101 and holder 104.

Light emitted by the light-emitting diodes in the LED unit 102 is focused by rod lenses in the rod lens array 103 onto, for example, a photosensitive image carrier such as a photosensitive drum (not shown) in an electrophotographic printer or copier.

Use of the combined LED/driver IC chips shown in the first to the third embodiments as the LED unit 102 enables the manufacture of LED heads with reduced size and increased quality, and with substantial reductions in material costs.

Fifth Embodiment

Referring to FIG. 18, a fifth embodiment of the invention is an image forming apparatus 200 comprising a yellow (Y) process unit 201, a magenta (M) process unit 202, a cyan (C) process unit 203, and a black (K) process unit 204, which are mounted following one another in tandem fashion. The cyan process unit 203, for example, includes a photosensitive drum 203a that turns in the direction indicated by the arrow, a charging unit 203b that supplies current to the photosensitive drum 203a to charge the surface thereof, an LED print head 203c that selectively illuminates the charged surface of the photosensitive drum 203a to form an electrostatic latent image, a developing unit 203d that supplies cyan toner particles to the surface of the photosensitive drum 203a to develop the electrostatic latent image, and a cleaning unit 203e that removes remaining toner from the photosensitive drum 203a. The print head 203c has, for example, the structure shown in FIG. 18, including one or more combined LED/driver IC chips of the type described in any of the first three embodiments. The other process units 201, 202, 204 are similar in structure to the cyan process unit 203, but use different toner colors.

Paper 205 (or other media) is held as a stack of sheets in a cassette 206. A hopping roller 207 feeds the paper 205 one sheet at a time toward a paired transport roller 210 and pinch roller 208. After passing between these rollers, the paper 205 travels to a registration roller 211 and pinch roller 209, which feed the paper toward the yellow process unit 201.

The paper 205 passes through the process units 201, 202, 203, 204 in turn, traveling in each process unit between the photosensitive drum and a transfer roller 212 made of, for example, semi-conductive rubber. The transfer roller 212 is charged so as to create a potential difference between it and the photosensitive drum. The potential difference attracts the toner image from the photosensitive drum onto the paper 205. A full-color image is built up on the paper 205 in four stages, the yellow process unit 201 printing a yellow image, the magenta process unit 202 a magenta image, the cyan process unit 203 a cyan image, and the black process unit 204 a black image.

From the black process unit 204, the paper 205 travels through a fuser 213, in which a heat roller and back-up roller apply heat and pressure to fuse the transferred toner image onto the paper. A first delivery roller 214 and pinch roller 216 then feed the paper 205 upward to a second delivery roller 215 and pinch roller 217, which deliver the printed paper onto a stacker 218 at the top of the printer.

The photosensitive drums and various of the rollers are driven by motors and gears not shown in the drawing.

The LED heads account for a significant part of the manufacturing cost of this type of LED printer 200. By using highly reliable and space-efficient combined LED/driver IC chips and enabling these chips to be manufactured by a simplified fabrication process with reduced material costs, the present invention enables a high-quality printer to be produced at a comparatively low cost. In particular, use of the LED head described in the fourth embodiment makes it possible to provide increased quality and space efficiency at a reduced cost.

The above embodiments have been described by using an LED epi-film as an exemplary thin semiconductor film, but various other types of thin semiconductor films can be employed instead, such as a thin semiconductor film including photodetector devices, logic devices, piezoelectric devices, or other applicable semiconductor devices instead of light-emitting devices.

Words such as 'above' and 'below' have been used for convenience in the above descriptions, but they do not indicate the absolute positions of components of the apparatus of the present invention.

Those skilled in the art will recognize that further variations are possible within the scope of the invention, which is defined in the appended claims.

What is claimed is:

1. A semiconductor apparatus comprising:
  a substrate having a first area and a second area, the first area and the second area being mutually exclusive, the first area including an electrical interconnection pattern;
  a thin semiconductor film disposed within the second area of the substrate, the thin semiconductor film being formed separately from the substrate and attached to the substrate, the thin semiconductor film including at least one semiconductor device, the thin semiconductor film having an edge facing the first area of the substrate;
  a first interconnecting line disposed at lest partly on the thin semiconductor film, the first interconnecting line having a first end, a second end, and an interconnecting part interconnecting the first and second ends, the first end of the first interconnecting line making electrical contact with the semiconductor device; and
  a second interconnecting line disposed at least partly on the substrate, the second interconnecting line having a first end making electrical contact with the electrical interconnection pattern of the substrate, a second end making electrical contact with the second end of the first interconnecting line, and an interconnecting part interconnecting the first and second ends of the second interconnecting line; wherein
  the second end of at least one of the first or second interconnecting lines is wider than the interconnecting parts of the first interconnecting line and the second interconnecting line.

2. The semiconductor apparatus of claim 1, wherein the second ends of the first interconnecting line and the second interconnecting line are disposed on the thin semiconductor film.

3. The semiconductor apparatus of claim 1, wherein the second ends of the first interconnecting line and the second interconnecting line are disposed on the substrate.

4. The semiconductor apparatus of claim 1, further comprising a layer of conductive material disposed between the thin semiconductor film and the substrate, the layer of conductive material being bonded to both the thin semiconductor film and the substrate, whereby the thin semiconductor film is attached to the substrate.

5. The semiconductor apparatus of claim 1, further comprising a dielectric film covering parts of the substrate and the thin semiconductor film, the interconnecting part of the second interconnecting line being disposed on the dielectric film.

6. The semiconductor apparatus of claim 5, wherein the dielectric film has an opening through which the second end of the second interconnecting line makes electrical contact with the second end of the first interconnecting line.

7. The semiconductor apparatus of claim 1, wherein the thin semiconductor film is an epitaxial film and the semiconductor device is a light-emitting device.

8. The semiconductor apparatus of claim 7, wherein the thin semiconductor film includes an array of light-emitting devices, said light-emitting device being one of said light-emitting devices, further comprising an array of first interconnecting lines and second interconnecting lines similar to the first interconnecting line and second interconnecting line described in claim 1, the first interconnecting lines and second interconnecting lines electrically coupling respective ones of the light-emitting devices to the electrical interconnection pattern of the substrate.

9. The semiconductor apparatus of claim 7, wherein the first interconnecting lines are formed before the thin semiconductor film is attached to the substrate.

10. The semiconductor apparatus of claim 1, wherein the substrate is a semiconductor substrate.

11. The semiconductor apparatus of claim 1, wherein the thin semiconductor film is divided into a plurality of unit thin semiconductor films, each unit thin semiconductor film comprising a plurality of semiconductor devices similar to said semiconductor device, wherein said first interconnecting line branches to make electrical contact with one semiconductor device in each of the unit thin semiconductor films, and the substrate includes an integrated circuit for driving the plurality of semiconductor devices, the electrical interconnection pattern being part of the integrated circuit.

12. The semiconductor apparatus of claim 11, wherein the semiconductor devices are light-emitting devices.

13. The semiconductor apparatus of claim 1, wherein the thin semiconductor film is divided into n unit thin semiconductor films, each unit thin semiconductor film comprising m semiconductor devices, m and n being integers greater than one, further comprising:

m branched interconnecting lines disposed on the thin semiconductor film, each branched interconnecting line having n first ends, one second end, and an interconnecting part interconnecting the n first ends to the second end, the n first ends making electrical contact with semiconductor devices in respective unit thin semiconductor films, the second end being disposed adjacent said edge of the thin semiconductor film, said first interconnecting line being one of the m branched interconnecting lines;

n common interconnecting lines disposed on respective unit thin semiconductor films, each common interconnecting line having a first end and a second end, the first end of the common interconnecting line making electrical with the unit thin semiconductor film on which the common interconnecting line is disposed, the second end of the common interconnecting line being disposed adjacent said edge of the thin semiconductor film; and m+n further interconnecting lines having respective first ends, respective second ends, and respective interconnecting parts connecting the respective first ends to the respective second ends, the first ends of the m+n further interconnecting lines making electrical contact with the electrical interconnection pattern of the substrate, the second ends of the m+n further interconnecting lines making electrical contact with respective second ends of the m branched interconnecting lines and the n common interconnecting lines, said second interconnecting line being one of the m+n further interconnecting lines; wherein the substrate includes an integrated circuit for driving the plurality of semiconductor devices, the electrical interconnection pattern being part of the integrated circuit.

14. The semiconductor apparatus of claim 13, wherein the semiconductor devices are light-emitting devices.

15. An optical print head including the semiconductor apparatus of claim 1.

16. The optical print head of claim 15, wherein the semiconductor device in the thin semiconductor film in the semiconductor apparatus is a light-emitting device, the semiconductor apparatus including a plurality of such light-emitting devices, the optical print head further including:

a base for supporting the semiconductor apparatus;

a rod lens array for focusing the light emitted by the light-emitting devices in the semiconductor apparatus;

a holder for holding the rod lens array; and at least one clamp for holding the base and the holder together.

17. An image-forming apparatus comprising at least one optical print head including the semiconductor apparatus of claim 1.

18. The image-forming apparatus of claim 17, further comprising:

a photosensitive image carrier selectively illuminated by the optical print head to form a latent electrostatic image;

a charging unit for electrically charging the photosensitive image carrier before illumination by the optical print head;

a developing unit for supplying a recording agent to develop the latent electrostatic image on the photosensitive image carrier; and a transfer unit for transferring the developed image from the photosensitive image carrier to printing media.

* * * * *